(12) United States Patent
Narendran et al.

(10) Patent No.: US 8,960,953 B2
(45) Date of Patent: Feb. 24, 2015

(54) LIGHTING SOURCE USING SOLID STATE EMITTER AND PHOSPHOR MATERIALS

(71) Applicant: Rensselaer Polytechnic Institute, Troy, NY (US)

(72) Inventors: Nadarajah Narendran, Clifton Park, NY (US); Yimin Gu, Los Gatos, CA (US)

(73) Assignee: Rensselaer Polytechnic Institute, Troy, NY (US)

(*) Notice: Subject to any disclaimer, the term of this patent is extended or adjusted under 35 U.S.C. 154(b) by 0 days.

(21) Appl. No.: 13/758,362

(22) Filed: Feb. 4, 2013

(65) Prior Publication Data

US 2013/0194779 A1    Aug. 1, 2013

Related U.S. Application Data

(63) Continuation of application No. 12/947,899, filed on Nov. 17, 2010, which is a continuation of application No. 11/642,089, filed on Dec. 20, 2006, now Pat. No. 7,837,348, which is a continuation-in-part of (Continued)

(51) Int. Cl.
| | |
|---|---|
| H01L 25/04 | (2014.01) |
| F21K 2/00 | (2006.01) |
| F21K 99/00 | (2010.01) |
| F21V 9/16 | (2006.01) |
| H01L 25/075 | (2006.01) |
| H01L 33/50 | (2010.01) |

(52) U.S. Cl.
CPC ... *F21K 2/00* (2013.01); *F21K 9/00* (2013.01); *F21V 9/16* (2013.01); *H01L 25/0753* (2013.01); *H01L 33/507* (2013.01); *H01L 2933/0091* (2013.01); *H01L 2924/0002* (2013.01)
USPC .............................................. 362/231; 362/84

(58) Field of Classification Search
USPC ...................... 362/310, 296.01, 297; 313/501
See application file for complete search history.

(56) References Cited

U.S. PATENT DOCUMENTS

| 3,555,337 A | 1/1971 | Faria et al. |
| 3,581,137 A | 5/1971 | Arnott et al. |
| 3,593,055 A | 7/1971 | Geusic et al. |

(Continued)

FOREIGN PATENT DOCUMENTS

| DE | 3632743 A1 | 3/1988 |
| DE | 41 41 587 A1 | 6/1993 |

(Continued)

OTHER PUBLICATIONS

USPTO Non-final Office Action issued in U.S. Appl. No. 12/947,899 dated Sep. 25, 2013.

(Continued)

*Primary Examiner* — Sharon Payne
(74) *Attorney, Agent, or Firm* — RatnerPrestia

(57) ABSTRACT

A light emitting apparatus has a light source for emitting a first light in a forward direction. A wavelength-converting layer is spaced apart from the light source and disposed in a path of the first light. The wavelength-converting layer is configured to absorb at least a portion of the first light and emit a second light. A reflective layer is configured to be reflective of at least the second light, and the wavelength-converting layer is disposed between the reflective layer and the light source.

15 Claims, 15 Drawing Sheets

Related U.S. Application Data application No. 10/583,105, filed as application No. PCT/US2005/015736 on May 5, 2005, now Pat. No. 7,819,549.

(60) Provisional application No. 60/568,373, filed on May 5, 2004, provisional application No. 60/636,123, filed on Dec. 15, 2004.

(56) References Cited

U.S. PATENT DOCUMENTS

| | | |
|---|---|---|
| 3,760,237 A | 9/1973 | Jaffe |
| 3,763,405 A | 10/1973 | Mitsuhata |
| 3,875,456 A | 4/1975 | Kano et al. |
| 4,729,076 A | 3/1988 | Masami et al. |
| 5,097,175 A | 3/1992 | Thomas |
| 5,187,765 A | 2/1993 | Muehlemann et al. |
| 5,208,462 A | 5/1993 | O'Connor et al. |
| 5,461,547 A | 10/1995 | Ciupke et al. |
| 5,477,430 A | 12/1995 | LaRosa |
| 5,499,138 A | 3/1996 | Iba |
| 5,535,230 A | 7/1996 | Abe |
| 5,622,423 A | 4/1997 | Lee |
| 5,711,594 A | 1/1998 | Hay |
| 5,777,433 A | 7/1998 | Lester et al. |
| 5,808,409 A | 9/1998 | Matsuda et al. |
| 5,813,752 A | 9/1998 | Singer et al. |
| 5,813,753 A | 9/1998 | Vriens et al. |
| 5,847,507 A | 12/1998 | Butterworth et al. |
| 5,959,316 A | 9/1999 | Lowery |
| 5,962,971 A | 10/1999 | Chen |
| 5,998,925 A | 12/1999 | Shimizu et al. |
| 6,007,209 A | 12/1999 | Pelka |
| 6,066,861 A | 5/2000 | Höhn et al. |
| 6,068,383 A | 5/2000 | Robertson et al. |
| 6,069,440 A | 5/2000 | Shimizu et al. |
| 6,084,250 A | 7/2000 | Jüstel et al. |
| 6,096,496 A | 8/2000 | Frankel |
| 6,155,699 A | 12/2000 | Miller et al. |
| 6,210,012 B1 | 4/2001 | Broer |
| 6,245,259 B1 | 6/2001 | Höhn et al. |
| 6,252,254 B1 | 6/2001 | Soules et al. |
| 6,294,800 B1 | 9/2001 | Duggal et al. |
| 6,350,041 B1* | 2/2002 | Tarsa et al. ............. 362/231 |
| 6,357,889 B1 | 3/2002 | Duggal et al. |
| 6,385,855 B1 | 5/2002 | Tymianski |
| 6,452,217 B1 | 9/2002 | Wojnarowski et al. |
| 6,469,322 B1 | 10/2002 | Srivastava et al. |
| 6,483,196 B1 | 11/2002 | Wojnarowski et al. |
| 6,491,412 B1 | 12/2002 | Bowman et al. |
| 6,501,102 B2 | 12/2002 | Mueller-Mach et al. |
| 6,513,949 B1 | 2/2003 | Marshall et al. |
| 6,576,930 B2 | 6/2003 | Reeh et al. |
| 6,576,935 B2 | 6/2003 | Onishi et al. |
| 6,580,097 B1 | 6/2003 | Soules et al. |
| 6,580,224 B2 | 6/2003 | Ishii et al. |
| 6,600,175 B1 | 7/2003 | Baretz et al. |
| 6,603,258 B1 | 8/2003 | Mueller-Mach et al. |
| 6,608,332 B2 | 8/2003 | Shimizu et al. |
| 6,614,170 B2 | 9/2003 | Wang et al. |
| 6,614,179 B1 | 9/2003 | Shimizu et al. |
| 6,616,862 B2 | 9/2003 | Srivastava et al. |
| 6,630,691 B1 | 10/2003 | Mueller-Mach et al. |
| 6,635,363 B1 | 10/2003 | Duclos et al. |
| 6,635,987 B1 | 10/2003 | Wojnarowski et al. |
| 6,653,765 B1 | 11/2003 | Levinson et al. |
| 6,672,741 B1* | 1/2004 | Young ............ 362/311.02 |
| 6,686,676 B2 | 2/2004 | McNulty et al. |
| 6,686,691 B1 | 2/2004 | Mueller et al. |
| 6,692,136 B2 | 2/2004 | Marshall et al. |
| 6,696,703 B2 | 2/2004 | Mueller-Mach et al. |
| 6,734,467 B2 | 5/2004 | Schlereth et al. |
| 6,791,259 B1 | 9/2004 | Stokes et al. |
| 6,793,374 B2 | 9/2004 | Begemann |
| 6,796,690 B2 | 9/2004 | Bohlander |
| 6,799,865 B2 | 10/2004 | Ellens et al. |
| 6,809,342 B2 | 10/2004 | Harada |
| 6,833,565 B2 | 12/2004 | Su et al. |
| 6,867,542 B1 | 3/2005 | Sun et al. |
| 6,936,857 B2 | 8/2005 | Doxsee et al. |
| 6,976,762 B2 | 12/2005 | Chien |
| 7,002,291 B2 | 2/2006 | Ellens et al. |
| 7,026,656 B2 | 4/2006 | Lin et al. |
| 7,038,370 B2 | 5/2006 | Mueller-Mach et al. |
| 7,040,774 B2 | 5/2006 | Beeson et al. |
| 7,048,385 B2 | 5/2006 | Beeson et al. |
| 7,049,740 B2 | 5/2006 | Takekuma |
| 7,052,152 B2 | 5/2006 | Harbers et al. |
| 7,192,161 B1 | 3/2007 | Cleaver et al. |
| 7,498,734 B2 | 3/2009 | Suehiro et al. |
| 2002/0003233 A1 | 1/2002 | Mueller-Mach et al. |
| 2002/0030444 A1 | 3/2002 | Muller-Mach et al. |
| 2002/0043926 A1 | 4/2002 | Takahashi |
| 2002/0047516 A1 | 4/2002 | Iwasa et al. |
| 2002/0084745 A1 | 7/2002 | Wang et al. |
| 2002/0167014 A1 | 11/2002 | Schlereth et al. |
| 2003/0002272 A1 | 1/2003 | Suehiro |
| 2003/0030060 A1 | 2/2003 | Okazaki |
| 2003/0067773 A1 | 4/2003 | Marshall et al. |
| 2003/0174499 A1 | 9/2003 | Bohlander |
| 2003/0189829 A1 | 10/2003 | Shimizu et al. |
| 2003/0201451 A1 | 10/2003 | Suehiro et al. |
| 2003/0218880 A1 | 11/2003 | Brukilacchio |
| 2003/0230751 A1 | 12/2003 | Harada |
| 2004/0016938 A1 | 1/2004 | Baretz et al. |
| 2004/0056260 A1 | 3/2004 | Slater, Jr. et al. |
| 2004/0116033 A1 | 6/2004 | Ouderkirk et al. |
| 2004/0124758 A1 | 7/2004 | Danielson et al. |
| 2004/0129945 A1* | 7/2004 | Uemura ............ 257/98 |
| 2004/0203312 A1 | 10/2004 | Bortscheller et al. |
| 2004/0208210 A1 | 10/2004 | Inoguchi |
| 2004/0217364 A1 | 11/2004 | Tarsa |
| 2004/0233664 A1 | 11/2004 | Beeson et al. |
| 2004/0263073 A1 | 12/2004 | Baroky et al. |
| 2004/0263074 A1 | 12/2004 | Baroky et al. |
| 2005/0041424 A1 | 2/2005 | Ducharme |
| 2005/0073495 A1 | 4/2005 | Harbers et al. |
| 2005/0093430 A1 | 5/2005 | Ibbetson et al. |
| 2005/0116635 A1 | 6/2005 | Walson et al. |
| 2005/0117125 A1 | 6/2005 | Minano et al. |
| 2005/0117366 A1 | 6/2005 | Simbal |
| 2005/0135117 A1 | 6/2005 | Lamb et al. |
| 2005/0162849 A1 | 7/2005 | Keuper |
| 2005/0174775 A1 | 8/2005 | Conner |
| 2005/0185419 A1 | 8/2005 | Holman et al. |
| 2005/0211991 A1 | 9/2005 | Mori et al. |
| 2005/0219476 A1 | 10/2005 | Beeson et al. |
| 2005/0237488 A1 | 10/2005 | Yamasaki et al. |
| 2005/0248958 A1 | 11/2005 | Li |
| 2005/0265029 A1 | 12/2005 | Epstein et al. |
| 2005/0276553 A1 | 12/2005 | Kazakevich et al. |
| 2005/0280785 A1 | 12/2005 | Beeson et al. |
| 2006/0002141 A1 | 1/2006 | Ouderkirk et al. |
| 2006/0007553 A1 | 1/2006 | Bogner |
| 2006/0034082 A1 | 2/2006 | Park et al. |
| 2006/0034084 A1 | 2/2006 | Matsuura et al. |
| 2006/0044523 A1 | 3/2006 | Teijido et al. |
| 2006/0044803 A1 | 3/2006 | Edwards |
| 2006/0049416 A1 | 3/2006 | Baretz et al. |
| 2006/0066192 A1 | 3/2006 | Beeson et al. |
| 2006/0067078 A1 | 3/2006 | Beeson et al. |
| 2006/0071225 A1 | 4/2006 | Beeson et al. |
| 2006/0072314 A1 | 4/2006 | Rains |
| 2006/0091788 A1 | 5/2006 | Yan |
| 2006/0097385 A1 | 5/2006 | Negley |
| 2006/0104090 A1 | 5/2006 | Lengyel et al. |
| 2006/0118805 A1 | 6/2006 | Camras et al. |
| 2006/0175625 A1 | 8/2006 | Yokotani |
| 2006/0186429 A1 | 8/2006 | Chew |
| 2006/0202219 A1 | 9/2006 | Ohashi |

(56) References Cited

U.S. PATENT DOCUMENTS

FOREIGN PATENT DOCUMENTS

| | | |
|---|---|---|
| EP | 1 160 883 A | 12/2001 |
| EP | 1 686 630 A | 8/2006 |
| EP | 1 691 425 A | 8/2006 |
| EP | 1 696 496 A | 8/2006 |
| JP | 48-102585 | 12/1973 |
| JP | 2-118959 | 9/1990 |
| JP | 2001-243807 | 9/2001 |
| JP | 2001-243821 | 9/2001 |
| JP | 2002-76434 | 3/2002 |
| JP | 2002-118291 | 4/2002 |
| JP | 2002-134795 | 5/2002 |
| JP | 2002-299694 | 10/2002 |
| JP | 2002-344029 | 11/2002 |
| JP | 2003-17751 | 1/2003 |
| JP | 2003-046140 | 2/2003 |
| JP | 2003-110145 | 4/2003 |
| JP | 2004-055160 | 2/2004 |
| JP | 2004-055229 | 2/2004 |
| JP | 2004-349647 | 9/2004 |
| WO | WO 00/24064 A | 4/2000 |
| WO | WO 01/40702 A1 | 6/2001 |
| WO | WO 2005/107420 | 11/2005 |
| WO | WO 2006/087651 | 8/2006 |

OTHER PUBLICATIONS

Kim J.K. et al., "Strongly Enhanced Phosphor Efficiency in GaInN White Light-Emitting Diodes Using Remote Phosphor Configuration and Diffuse Reflector Cup," Japanese Journal of Applied Physics, Part 2 (Letters) Japan Soc. Apl. Phys Japan, vol. 44, No. 21, 2005, pp. L649-L651.
Krames M.R. et al., "High-power III-nitride emitters for solid-state lighting," Phys. Stat. sol. (a) Wiley-VCH Verlag Berlin GmbH, Berlin, vol. 192, No. 2 (2002) pp. 237-245.
Akos Borbely, et al., Prediction of Light Extraction Efficiency of LEDs by Ray Trace Simulation, Third International Conference on Solid STate LIghting, Proc. of SPIE vol. 5187, pp. 301-308.
Song Jae Lee, Study of Photon Extraction Efficiency in InGaN Light-Emitting Diodes Depending on Chip Structures and Chip-Mount Schemes, Optical Engineering, Jan. 2006, vol. 45(1), pp. 014601-1-014601-14.
D.A. Vanderwater et al., High-Brightness AlGaInP Light Emitting Diodes, Proceedings of the IEE, vol. 85, No. 11, Nov. 1997, pp. 1752-1764.
Kenichi Yamada et al., Optical Simulation of Light Source Devices Composed of Blue LEDs and YAG Phosphor, J. Light & Vis. Env. vol. 27, No. 2, 2003, pp. 10-14.
N. Narendran et al., Solid-state Lighting: failure analysis of white LEDs, Journal of Crystal Growth, 268 (2004) 449-456.
M. Arik et al., Effects of Localized Heat Generations Due to the Color Conversion in Phosphor Particles and Layers of High Brightness Light Emitting Diodes, American Society of Mechanical Engineers (ASME), Proceedings of InterPACK '03, International Electronic Packaging Technical Conference and Exhibition, Maui, Hawaii, Jul. 2003, pp. 1-9, title page, copyright page and abstract page.
International Search Report for PCT International Application No. PCT/US2005/015736 dated Feb. 27, 2006 (3 pages).
International Search Report for PCT International Application Serial No. PCT/US2007/012311 dated Feb. 15, 2008.
International Search Report for PCT International Application Serial No. PCT/US2007/013132 dated Dec. 3, 2007.
International Search Report for PCT International Application Serial No. PCT/US2007/013132 dated Jan. 31, 2008.
First Office Action for Chinese Application No. 2005800222839 dated Jul. 8, 2008 (including English translation).
English language translation of Third Office Action in Chinese Patent Application No. 200580022283.9 mailed on Jan. 22, 2010.
USPTO Office Action for U.S. Appl. No. 10/583,105 dated Nov. 4, 2008.
USPTO Office Action for U.S. Appl. No. 11/642,154 dated Sep. 25, 2008.
USPTO Office Action for U.S. Appl. No. 10/583,105 dated Apr. 12, 2010.
USPTO Office Action for U.S. Appl. No. 10/583,105 dated Jun. 19, 2009.
USPTO Office Action for U.S. Appl. No. 10/642,154 dated Jun. 2, 2009.
USPTO Office Action for U.S. Appl. No. 11/644,815 dated Sep. 18, 2009.
USPTO Office Action for U.S. Appl. No. 11/644,815 dated Feb. 3, 2009.
European Search Report for Application No. EP 05 76 1021 dated Jun. 18, 2008.
European Office Action for EP Application No. 05 761 021.4 dated Oct. 8, 2009.
Chinese Second Office Action for Chinese Patent Application No. 200780046853.7 mailed Apr. 11, 2012.
Japanese Office Action for Japanese Application No. 2009-542751 mailed May 29, 2012.
Korean Office Action for Korean Patent Application No. 10-2006-7025619 mailed May 10, 2012.
Yamada et al., "Optical Simulation of Light Source Devices Composed of Blue LEDs and YAG Phosphor," J. Light & Vis. Env. vol. 27, No. 2, 2003, pp. 10-14.
Japanese Office Action for Japanese Patent Application No. 2007-511606 mailed Sep. 12, 2012.
Notice of Reasons for Rejection issued by JPO for Japanese Application No. 2011-147334 mailed Feb. 15, 2013.
Decision of Final Rejection issued by JPO for Japanese Application No. 2009-542751 mailed Jan. 29, 2013.
Canadian Office Action issued in CA 2,672,214 dated Apr. 24, 2014.
JPO Notice of Reasons for Rejection issued in Japanese Patent Application No. 2013-112568 mailed May 13, 2014.

* cited by examiner

LIGHTING SOURCE USING SOLID STATE EMITTER AND PHOSPHOR MATERIALS

CROSS REFERENCE TO RELATED APPLICATIONS

This application is a continuation of U.S. patent application Ser. No. 12/947,899, filed Nov. 17, 2010 which is a continuation of U.S. application Ser. No. 11/642,089, filed Dec. 20, 2006 (now U.S. Pat. No. 7,837,348) which is a continuation-in-part application of U.S. application Ser. No. 10/583,105, filed Jun. 15, 2006 (now U.S. Pat. No. 7,819,549), entitled "High Efficiency Light Source Using Solid-State Emitter And Down-Conversion Material," which is the 371 National Phase of International Application No. PCT/US2005/015736, filed May 5, 2005, which claims the benefit of priority to U.S. Provisional Application Ser. No. 60/568,373, filed May 5, 2004 and to U.S. Provisional Application Ser. No. 60/636,123, filed Dec. 15, 2004. The contents of all of these applications are incorporated in their entirety by reference herein.

BACKGROUND OF THE INVENTION

Solid state light emitting devices, including solid state lamps having light emitting diodes (LEDs) and resonant cavity LEDs (RCLEDs) are extremely useful, because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. Because large scale semiconductor manufacturing techniques may be used, many solid state lamps may be produced at extremely low cost.

In addition to applications such as indicator lights on home and consumer appliances, audio visual equipment, telecommunication devices and automotive instrument markings, LEDs have found considerable application in indoor and outdoor informational displays.

With the development of efficient LEDs that emit short wavelength (e.g., blue or ultraviolet (UV)) radiation, it has become feasible to produce LEDs that generate white light through down conversion (i.e., phosphor conversion) of a portion of the primary emission of the LED to longer wavelengths. Conversion of primary emissions of the LED to longer wavelengths is commonly referred to as down-conversion of the primary emission. An unconverted portion of the primary emission combines with the light of longer wavelength to produce white light.

Phosphor conversion of a portion of the primary emission of the LED chip is attained by placing a phosphor layer in an epoxy that is used to fill the reflector cup, which houses the LED chip within the LED lamp. The phosphor is in the form of a powder that is mixed into the epoxy prior to curing the epoxy. The uncured epoxy slurry containing the phosphor powder is then deposited onto the LED chip and is subsequently cured.

The phosphor particles within the cured epoxy generally are randomly oriented and interspersed throughout the epoxy. A portion of the primary radiation emitted by the LED chip passes through the epoxy without impinging on the phosphor particles, and another portion of the primary radiation emitted by the LED chip impinges on the phosphor particles, causing the phosphor particles to emit longer wavelength radiation. The combination of the primary short wavelength radiation and the phosphor-emitted radiation produces white light.

Current state of the art phosphor-converted white LED (pc-LED) technology is inefficient in the visible spectrum. The light output for a single pc-white LED is below that of typical household incandescent lamps, which are approximately 10 percent efficient in the visible spectrum. An LED device having a light output that is comparable to a typical incandescent lamp's power density necessitates a larger LED chip or a design having multiple LED chips. Moreover, a form of direct energy absorbing cooling must be incorporated to handle the temperature rise in the LED device itself. More particularly, the LED device becomes less efficient when heated to a temperature greater than 100° C., resulting in a declining return in the visible spectrum. The intrinsic phosphor conversion efficiency, for some phosphors, drops dramatically as the temperature increases above approximately 90° C. threshold.

U.S. Pat. No. 6,452,217 issued to Wojnarowski et al. is directed to a high power LED lamp or multiple LED lamp design for use in lighting products and a source of heat removal therefrom. It has LED die arranged in a multi-dimensional array. Each LED die has a semiconductor layer and phosphor material for creation of white light. A reflector gathers and focuses the light from each of the die to approximate a high power LED lamp. FIG. 12 of the patent illustrates a multi-sided array which emits light at angled ray trace paths. FIG. 19 of the patent illustrates the LED lamp head being angled.

U.S. Pat. No. 6,600,175 issued to Baretz et al. and U.S. Patent Application Publication No. 2004/0016938 filed by Baretz et al. are directed to solid state light emitting devices that produce white light. The '938 patent application publication is a continuation of the '175 patent. The solid state light emitting device generates a shorter wavelength radiation that is transmitted to a luminophoric medium for down conversion to yield white light. In FIGS. 2 and 6 of the patent, there is a spaced relationship between the LED and the luminophoric medium. In FIG. 6, for example, light is emitted from the solid state device 82 of shorter wavelength radiation, preferably in the wavelength range of blue to ultraviolet. When luminophoric medium 90 is impinged with the shorter wavelength radiation, it is excited to responsively emit radiation having a wavelength in the visible light spectrum in a range of wavelengths to produce light perceived as white.

U.S. Pat. No. 6,630,691 issued to Mueller-Mach et al. is directed to an LED device comprising a phosphor-converting substrate that converts a fraction of the primary light emitted by a light emitting structure of the LED into one or more wavelengths of light that combine with unconverted primary light to produce white light. As shown in FIG. 1 of the patent, LED 2 is disposed on substrate 10 which is a phosphor. As shown in FIG. 2 of the patent, reflective electrode 21 is disposed on the surface of the LED. Some primary light emitted by the LED impinges on reflective electrode 21, which reflects the primary light back through the LED and through the substrate. Some of the primary light propagating into the substrate is converted into yellow light and some is not converted. When the two types of light are emitted by the substrate, they combine to produce white light. Utilizing a reflective electrode improves the efficiency of the LED device by ensuring that the amount of primary light entering the substrate is maximized.

U.S. Patent Application Publication No. 2002/0030444 filed by Muller-Mach et al., which issued as U.S. Pat. No. 6,696,703 to Mueller-Mach et al., is directed to a thin film phosphor-converted LED structure. FIG. 2 of the application shows an LED structure 2 and a phosphor thin film 21 on a surface of LED 2. The LED generates blue light that impinges on phosphor film 21. Some light passes through phosphor 21 and some is absorbed and converted into yellow light which is emitted from phosphor 21. The blue and yellow light combine to form white light. In FIG. 3 of the application, a reflective pad 25 is on a surface of LED 2. Light from LED 2 is reflected by reflective pad 25 back through LED 2 and into phosphor 21. Light is then combined, as shown in FIG. 2 of the patent. FIG. 4 of the patent uses two phosphor films 31, 33 that are separated from LED 2 by substrate 13. Film 31 emits red light. Film 33 emits green light. Blue light emitted by LED 2 passes through films 31, 33, which combines with the red and green light to produce white light. In the embodiment of FIG. 5 of the application, LED device 50 includes a plurality of phosphor thin films 37 and 38. A dielectric mirror 36 is disposed between thin film 37 and substrate 13. The dielectric mirror 36 is fully transparent to the primary emission of light emitting structure 2, but is highly reflective at the wavelength of the emissions of the phosphor thin films 37 and 38.

U.S. Patent Application Publication No. 2002/0030060 filed by Okazaki is directed to a white semiconductor light-emitting device provided with an ultraviolet light-emitting element and a phosphor. The phosphor layer has a blue light-emitting phosphor and a yellow light-emitting phosphor, mixedly diffused. The light-emitting device 3 is inside is reflective case 5. In FIGS. 2, 4, and 8 of the application, phosphor layer 6 is formed away from light-emitting element 3. In FIG. 2 of the application shows phosphor layer 6 formed inside sealing member 7, which is formed from a translucent resin. In FIGS. 4 and 8 of the application, the phosphor layer is formed on the surface of sealing member 7.

U.S. Patent Application Publication No. 2002/0218880, filed by Brukilacchio, is directed to an LED white light optical system. As shown in FIG. 1 of the application, optical system 100 includes LED optical source 110, optical filter 120, reflector 130, phosphor layer 135, concentrator 140, a first illumination region 150, a second illumination region 170, and thermal dissipater 190. Optical filter 120 includes a reflected CCT range and a transmitted CCT range. Optical energy that is within the reflected CCT range is prohibited from passing through optical filter 120 (e.g., via reflection). Optical energy that enters the optical filter front face 121 from the phosphor layer back face 137 that is in the reflected range of optical filter 120 is reflected back into phosphor layer 135. Optical energy that is in the transmitted CCT range of optical filter 120 transmits through filter 120 and interacts with reflector 130.

The reflector 130 is a reflective optical element positioned to reflect optical energy emitted from the LED optical source back face 112 back into LED optical source 110. The optical energy interacts with the optical material and a portion of the optical energy exits LED front face 111 and interacts with optical filter 120. The optical energy then continues into the phosphor layer, thereby providing a repeating telescoping circular process for the optical energy that emits from the phosphor layer back face 137. This repeating process captures optical energy that otherwise is lost. Concentrator 140 captures optical energy emitting out of the phosphor layer front face 136.

U.S. Patent Application Publication No. 2002/0003233 filed by Mueller-Mach et al., which issued as U.S. Pat. No. 6,501,102 to Mueller-Mach et al., are directed to a LED device that performs phosphor conversion on substantially all of the primary radiation emitted by the light emitting structure of the LED device to produce white light. The LED device includes at least one phosphor-converting element located to receive and absorb substantially all of the primary light emitted by the light-emitting structure. The phosphor-converting element emits secondary light at second and third wavelengths that combine to produce white light. Some embodiments use a reflective electrode on the surface of the light emitting structure and some do not. In embodiments that use a reflective electrode 21 (FIGS. 2, 3, 6, 7 of the application), a substrate separates the light emitting structure from the phosphor layers. That is, the light emitting structure is on one side of the substrate and a phosphor layer is on the other side of the substrate. In embodiments that do not use a reflective electrode (FIGS. 4, 5 of the application), a phosphor layer is disposed on a surface of the light emitting structure.

U.S. Pat. No. 6,686,691 issued to Mueller et al. is directed to a tri-color lamp for the production of white light. The lamp employs a blue LED and a mixture of red and green phosphors for the production of white light. As shown in FIG. 3, lamp 20 includes LED 22 which is positioned in reflector cup 28. LED 22 emits light in a pattern indicated by lines 26 and a phosphor mixture 24 is positioned in the pattern. It may be seen that some unabsorbed light emitted by LED 22 reflects from walls of reflector cup 28 back to phosphor mixture 24. Reflector cup 28 may modify light pattern 26, if light is reflected into a space not previously covered by the initial light pattern. The walls of the reflector cup may be parabolic.

U.S. Pat. Nos. 6,252,254 and 6,580,097, both issued to Soules et al., are directed to an LED or laser diode coated with phosphors. The '097 patent is a division of the '254 patent. More particularly, the patents disclose a blue-emitting LED covered with a phosphor-containing covering. The phosphor-containing covering contains green-emitting phosphors and red-emitting phosphors. The green and red phosphors are excitable by the blue-emitting LED.

U.S. Pat. No. 6,513,949 issued to Marshall et al., U.S. Pat. No. 6,692,136 issued to Marshall et al., and U.S. Patent Application Publication No. 2002/0067773 filed by Marshall et al. are directed to an LED/phosphor/LED hybrid lighting system. The '136 patent is a continuation of the '949 patent. The '773 patent application issued as the '136 patent. As shown in FIG. 1A, LED 10 includes an LED chip mounted in a reflective metal dish or reflector 12 filled with a transparent epoxy 13. FIG. 1B schematically depicts a typical phosphor-LED 14 which is substantially identical in construction to the LED of FIG. 1A, except that the epoxy 18 filling the reflector 16 contains grains 19 of one or more types of luminescent phosphor materials mixed homogeneously therein. The phosphor grains 19 convert a portion of the light emitted by LED chip 15 to light of a different spectral wavelength. The system permits different lighting system performance parameters to be addressed and optimized as deemed important by varying the color and number of the LEDs and/or the phosphor of the phosphor-LED.

U.S. Pat. No. 6,603,258, issued to Mueller-Mach et al., is directed to a light emitting diode device that produces white light by combining primary bluish-green light with phosphor-converted reddish light. The LED is mounted within a reflector cup that is filled with a phosphor-converting resin. Primary radiation emitted by the LED impinges on the phosphor-converting resin. Part of the primary radiation impinging on the resin is converted into reddish light. An unconverted portion of the primary radiation passes through the resin and combines with the reddish light to produce white light.

U.S. Pat. No. 6,616,862, issued to Srivastava et al., is directed to halophosphate luminescent materials co-activated with europium and manganese ions. FIG. 3 of the patent discloses an LED mounted in cup 120 having a reflective surface 140 adjacent the LED. The embodiment includes a transparent case 160 in which phosphor particles 200 are dispersed. Alternatively, the phosphor mixed with a binder may be applied as a coating over the LED surface. A portion of blue light emitted by the LED that is not absorbed by the phosphor and the broad-spectrum light emitted by the phosphor are combined to provide a white light source.

U.S. Pat. Nos. 6,069,440, 6,614,179, and 6,608,332, issued to Shimazu et al., are directed to a light emitting device comprising a phosphor which converts the wavelength of light emitted by a light emitting component and emits light. These patents also disclose a display device using multiple light emitting devices arranged in a matrix. These patents are related because they flow from the same parent application.

U.S. Pat. No. 6,580,224 issued to Ishii et al. is directed to a backlight for a color liquid crystal display device, a color liquid crystal display device, and an electroluminescent element for a backlight of a color liquid crystal display device.

U.S. Patent Application Publication No. 2002/0167014 filed by Schlereth et al., which issued as U.S. Pat. No. 6,734,467 to Schlereth et al., are directed to an LED white light source having a semiconductor LED based on GaN or InGaN which is at least partly surrounded by an encapsulation made of a transparent material. The transparent material contains a converter substance for at least partial wavelength conversion of the light emitted by the LED. The LED has a plurality of light-emitting zones by which a relatively broadband light emission spectrum is generated energetically above the emission spectrum of the converter substance.

A publication entitled "Optical simulation of light source devices composed of blue LEDs and YAG phosphor" by Yamada K., Y. Imai, and K Ishii, published in Journal of Light and Visual Environment 27(2): 70-74 (2003) discloses using light reflected from a phosphor as an effective way of obtaining high output from light sources composed of LEDs and phosphor.

SUMMARY OF THE INVENTION

A light emitting apparatus comprises a radiation source for emitting multi-colored radiation. A diffuser material receives at least a portion of the multi-colored radiation emitted by the radiation source and converts the multi-colored radiation into forward transferred radiation and back transferred radiation. An optic device is coupled to the diffuser material and is adapted to receive the back transferred radiation and extract at least a portion of the back transferred radiation from the optic device.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

Figure 14:
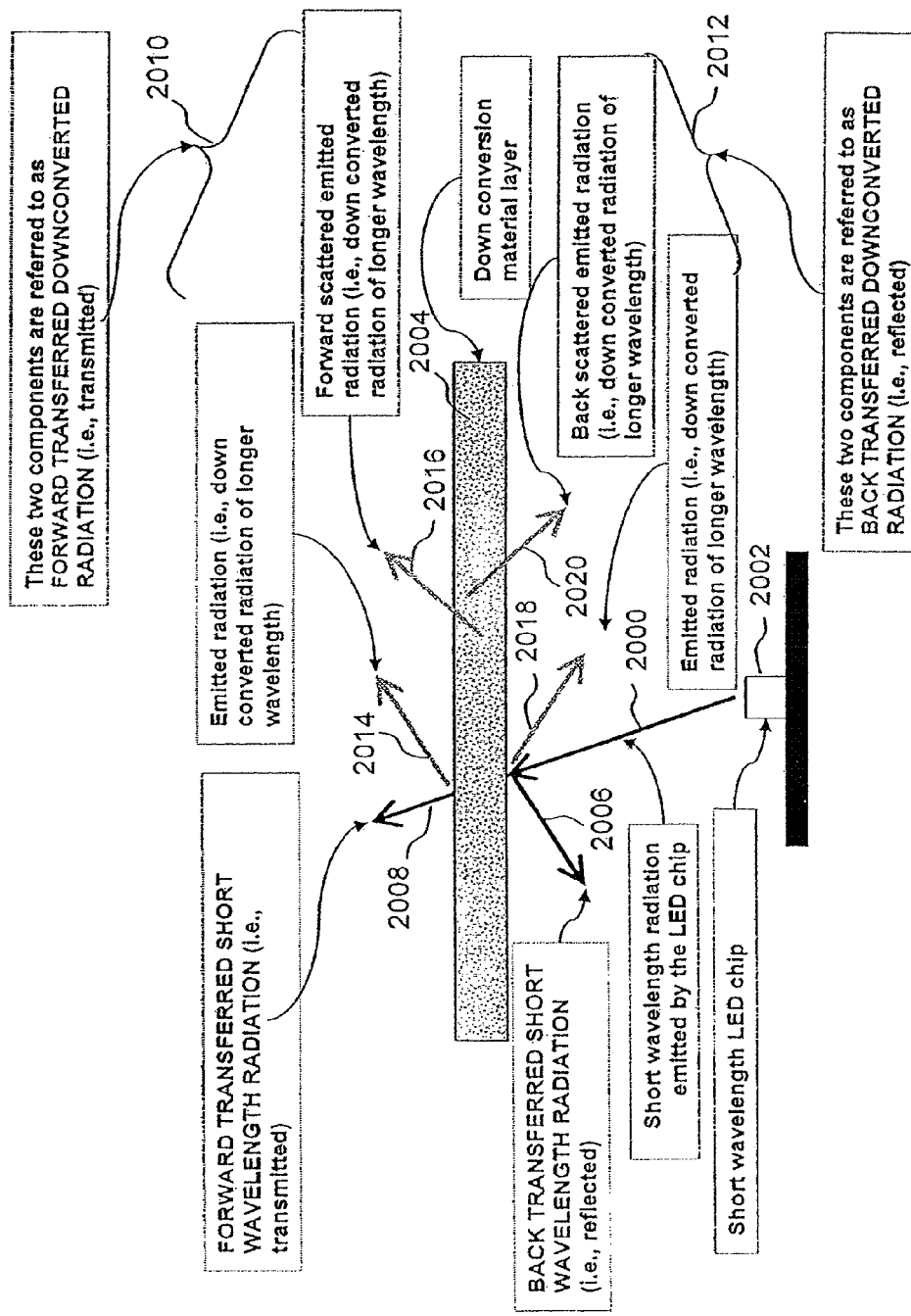
FIG. 14 is a diagram illustrating the exemplary radiation rays that may result when an exemplary radiation ray from a short-wavelength LED chip impinges on a layer of down conversion material.

FIG. 14 is a diagram illustrating the exemplary radiation rays that may result when an exemplary radiation ray 2000 from a short-wavelength LED chip 2002 impinges on a layer of down conversion material 2004 which may be a phosphor layer. The impingement of exemplary short-wavelength radiation 2000 from a short-wavelength source such as an LED chip 2002 onto a down conversion material layer 2004 may produce radiation with four components: back transferred short-wavelength radiation 2006 reflected from the down conversion material layer 2004; forward transferred short-wavelength radiation 2008 transmitted through the down conversion material layer 2004; forward transferred down-converted radiation 2010 transmitted through the down conversion material 2004; and back transferred down-converted radiation 2012 reflected from the down conversion material 2004. The four components may combine to produce white light.

Two of the four components 2010 and 2012 may each be comprised of two sub-components. One of the sub-components of forward transferred down-converted radiation may be emitted radiation 2014; i.e., down-converted radiation having a longer wavelength than the short-wavelength radiation that impinges onto the down conversion material layer 2004. The emitted radiation sub-component 2014 of forward transferred down-converted radiation may be produced by short-wavelength radiation 2000 impinging on particles of the down conversion material 2004 as it is transmitted through the down conversion material 2004. The second sub-component of forward transferred down-converted radiation may be forward scattered emitted radiation 2016; i.e., other down-converted radiation having a longer wavelength than the short-wavelength radiation 2000 that impinges onto the down conversion material layer 2004. The forward scattered emitted radiation sub-component 2016 of forward transferred down-converted radiation 2010 may be produced by short-wavelength radiation 2000 impinging on particles of the down conversion material 2004 and that also bounces back and forth on the particles of the down conversion material 2004 before being transmitted through the down conversion material 2004.

One of the sub-components of back transferred down-converted radiation 2012 may be emitted radiation 2020; i.e., down-converted radiation having a longer wavelength than the short-wavelength radiation 2000 that impinges onto the down conversion material layer 2004. The emitted radiation sub-component 2018 of back transferred down-converted radiation 2012 may be produced by short-wavelength radiation 2000 impinging on particles of the down conversion material 2004 as it is reflected from the down conversion material 2004. The second sub-component of back transferred down-converted radiation 2012 may be back scattered emitted radiation 2020; i.e., other down-converted radiation having a longer wavelength than the short-wavelength radiation 2000 that impinges onto the down conversion material layer 2004. The back scattered emitted radiation sub-component 2020 of back transferred down-converted radiation 2012 may be produced by short-wavelength radiation 2000 impinging on particles of the down conversion material 2004 and that also bounces back and forth on the particles of down conversion material 2004 before being reflected from the down conversion material 2004.

White light may be produced by the combinations of the various components to discussed above. In the forward transferred direction (i.e., for radiation 2008, 2014, 2016, 2010 that is transmitted through the down conversion material layer), white light may be produced by the combination of forward transferred short-wavelength radiation 2008 with either or both of the sub-components 2014, 2016 of the forward transferred down-converted radiation 2010. That is, white light may be produced in the forward transferred direction by the combination of forward transferred short-wavelength light 2008 with transmitted emitted radiation 2014 and/or with transmitted forward scattered emitted radiation 2016.

In the back transferred direction (i.e., for radiation 2006, 2018, 2020, 2012 that is reflected from the down conversion material layer), white light may be produced by the combination of back transferred short-wavelength radiation 2006 with either or both of the sub-components 2018, 2020 of the back transferred down-converted radiation 2012. That is, white light may be produced in the back transferred direction by the combination of back transferred short-wavelength light 2006 with reflected emitted radiation 2018 and/or with reflected back scattered emitted radiation 2020.

The wavelength of the forward transferred short-wavelength radiation 2008 may be about the same as the wavelength of the radiation 2000 emitted by a radiation source such as an LED chip 2002. The wavelength of the back transferred short wavelength radiation 2006 may be about the same as the wavelength of the radiation 2000 emitted by the radiation source 2002. The wavelength of the forward transferred short-wavelength radiation 2008 may be about the same as the wavelength of the back transferred short-wavelength radiation 2006. In an exemplary embodiment, the radiation source 2002 may emit radiation exhibiting a wavelength that is less than 550 nm, more particularly in a range of about 200 nm to less than 550 nm. Accordingly, the wavelength of the forward transferred short-wavelength radiation 2008 and the wavelength of the back transferred short-wavelength radiation 2006 may be less than 550 nm, more particularly in a range of about 200 nm to less than 550 nm.

The wavelength of the forward transferred down-converted radiation 2010 (including its sub-components 2014, 2016) and the wavelength of the back transferred down-converted radiation 2012 (including its sub-components 2018, 2020) may be any wavelength that is longer that the excitation spectrum of the down conversion material 2004. In an exemplary embodiment, the excitation spectrum of the down conversion material 2004 may be in the range of about 300 nm to about 550 nm. In alternative embodiments, other down conversion materials may be used that have an excitation spectrum other than in the range of about 300 nm to about 550 nm. The excitation spectrum of the down conversion material 2004 should produce radiation having a wavelength that is longer than the wavelength of the radiation produced by the short-wavelength emitting radiation source 2002. In an exemplary embodiment, the down conversion material 2004 may produce radiation in the range of from about 490 nm to about 750 nm.

However, if the LED chip 2002 does not emit short-wavelength radiation, or if the wavelength of radiation emitted by the LED chip is greater than the excitation spectrum of the down-conversion material, the down-conversion material layer 2004 behaves like a diffuser element. Therefore, only two components may be produced by the down conversion material 2004: forward transferred radiation 2008 transmitted through the down-conversion material 2004, and back transferred radiation 2006 reflected from the down-conversion material 2004.

The inventors have discovered that the performance of phosphor converted LEDs is negatively affected when placing the down-conversion phosphor close to the LED die. Poor performance is mainly due to the fact that the phosphor medium surrounding the die behaves like an isotropic emitter, and some portion of the back transferred radiation towards the die circulates between the phosphor layer, the die, and the reflector cup. As a result, the back transferred radiation increases the junction temperature, thus reducing system efficacy and increasing the yellowing of the encapsulant. All of these factors reduce the light output over time.

Figure 1:
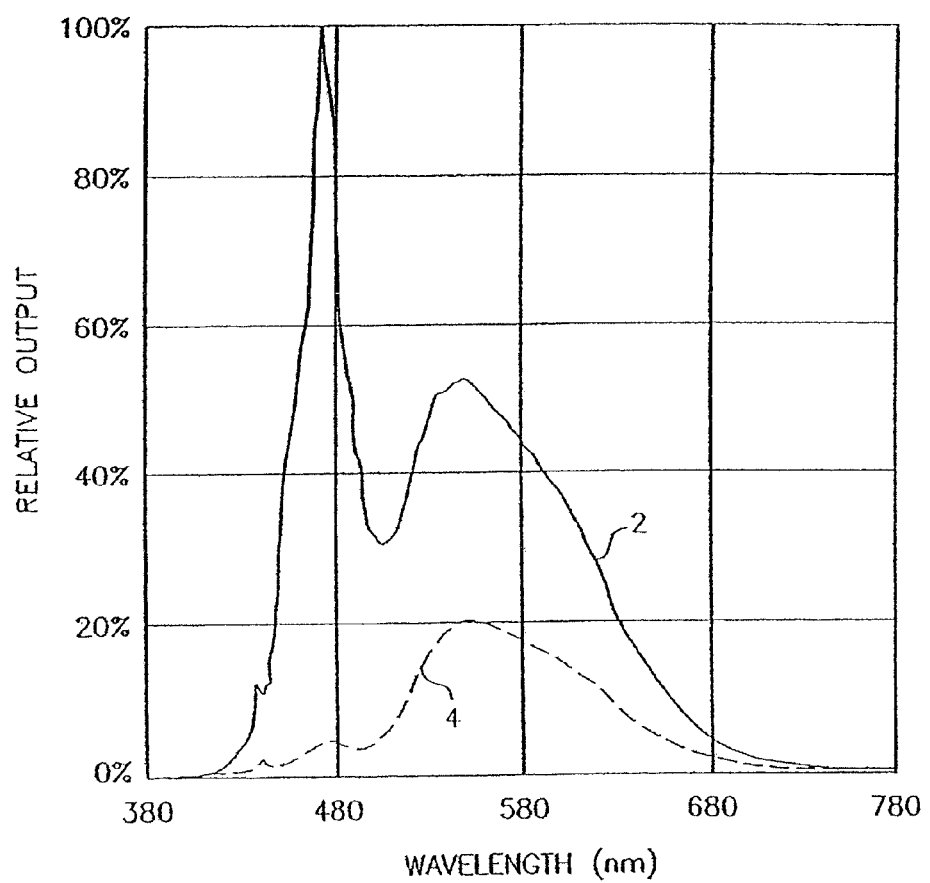
FIG. 1 is a graph of relative output versus wavelength showing reflected and transmitted spectral distribution of light for one type of phosphor (YAG:Ce)

The literature shows that 60 percent of the light impinging on the phosphor layer is back transferred, contributing to the described effects (Yamada, et al., 2003). Lab measurements of eight YAG:Ce phosphor plates proved that nearly 60% of the radiant energy is transferred back in the direction of the blue LED source. The absolute magnitude of the radiant energy reflected depends, among other factors, on the density of the phosphor coating. FIG. 1 shows the measured reflected spectral power distribution 2 of a blue LED with a YAG:Ce phosphor plate. FIG. 1 also shows the measured transmitted spectral power distribution 4 of the same arrangement. As shown, most of the light is reflected back and not transmitted forwardly.

Such effects are expected to be of a higher magnitude in RCLEDs, because their light output is much more collimated. Consequently, the packaging attempts to capture the transmitted, emitted, and reflected components to improve system efficiency. Additionally, the inventors have created packaging that allows the phosphor layer to be moved away from the die, preventing radiation feedback into the LED and RCLED. As a result, the packaging increases the efficiency of the device by allowing more of the radiation reflected off and emitted by the phosphor layer to exit the device. At the same time, radiation from the RCLED impinges on the phosphor layer uniformly to obtain a uniform white light source. In addition, the life of the LED and RCLED is improved In traditional phosphor-converted white LEDs, where the phosphor is placed adjacent the die, more than 65% of the light generated by the phosphor is back-scattered and lost within the LED package. Based on these findings, a technique referred to as Scattered Photon Extraction™ (SPE™) has been developed. An aspect of the technique has been disclosed in pending International Application No. PCT/US2005/015736 filed on May 5, 2005 and published as WO 2005/107420 A2 on Nov. 17, 2005.

To increase the light output from a phosphor-converted white LED (pc-LED) and to achieve higher luminous efficacy, the down-conversion material (e.g., phosphor or quantum dots) is removed to a remote location and a properly tailored optic device is placed between the LED chip and the down-conversion material layer. Then, the back transferred light can be extracted to increase the overall light output and efficacy. This technique significantly increases the overall light output and luminous efficacy of a pc-white LED by extracting the phosphor emitted and back scattered reflected radiation, and the reflected short-wavelength radiation that otherwise would be lost.

Figure 2:
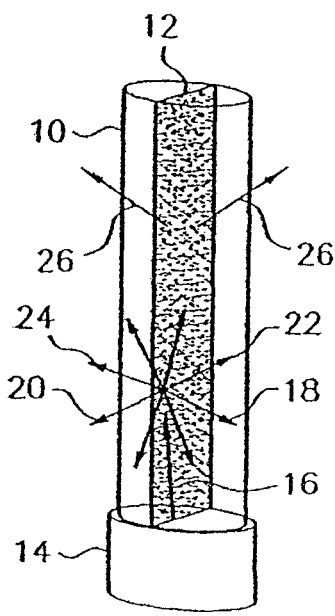
FIG. 2 is a high efficiency light source that uses solid state emitter(s) and down conversion material, in accordance with an exemplary embodiment of the present invention.
Figure 3:
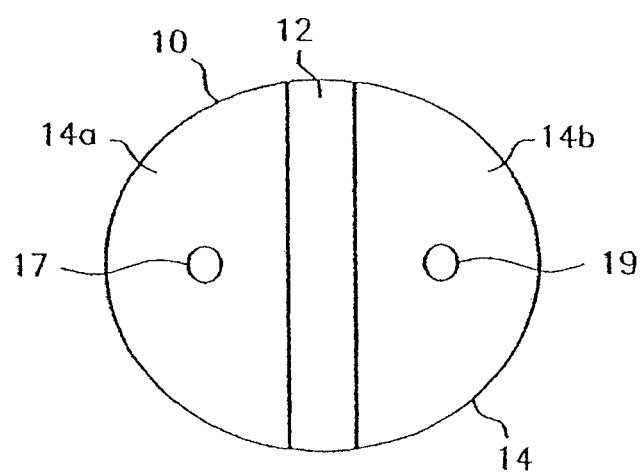
FIG. 3 is a cross-sectional view of a bottom portion of the high efficiency light source shown in FIG. 2.

FIGS. 2 and 3 illustrate a first exemplary embodiment of the invention using the SPE™ concept. FIG. 2 illustrates a high efficiency light source that uses solid state emitter(s) and down conversion material, in accordance with an exemplary embodiment of the present invention.

This embodiment has a distributing optic, light transmissive, enclosure optic 10, which has a cylindrical geometry. As shown, enclosure optic 10 includes phosphor layer 12 embedded in the middle section of the distributing optic. This configuration effectively splits the distributing optic into substantially two equal pieces, or portions. That is, the phosphor layer may be a strip that is substantially parallel to a longitudinal axis of cylindrical optic 10.

In one exemplary embodiment, phosphor layer 12 may be a YAG:Ce phosphor layer. In an alternative exemplary embodiment, the phosphor layer may comprise other phosphors, quantum dots, quantum dot crystals, quantum dot nano crystals or other down conversion material. It will be understood that other embodiments of the present invention may include a phosphor layer that is similar to phosphor layer 12. Unlike the embedded phosphor layer, shown in FIG. 2, however, other embodiments may have a phosphor layer that is not embedded. Moreover, the phosphor layer need not be of uniform thickness, rather it may be of different thicknesses or different phosphor mixes to create a more uniform color output.

One or more LEDs or RCLEDs may be placed inside the cylindrical optic at a bottom portion, designated as 14. In an alternative embodiment, one or more LEDs/RCLEDs may be placed at a location other than at the bottom portion of the cylindrical optic.

Short wavelength radiation 16 is emitted from the LEDs/RCLEDs. Short wavelength radiation is in the range of 250 nm to 500 nm. Because phosphor layer 12 is substantially in the middle of the cylindrical optic, short-wavelength radiation from the LEDs/RCLEDs causes short-wavelength radiation to impinge from either side of the cylindrical optic onto the phosphor layer 12. The impingement of short-wavelength radiation onto the phosphor layer 12 may produce radiation with four components: short-wavelength radiation 18, back transferred from the phosphor layer 12; short-wavelength radiation 20, forward transferred through the phosphor layer 12; down-converted radiation 22, back transferred from the phosphor layer 12; and down-converted radiation 24, forward transferred through the phosphor layer 12. These four components, which are produced on both sides of the phosphor layer 12, combine and produce white light 26. By using the light transmissive properties of the cylindrical optic 10, the back transferred short-wavelength radiation from the phosphor layer 12 and the down-converted radiation back transferred from the phosphor layer 12 may be extracted. Therefore, the overall light output and efficacy of a phosphor-converted white LED device is significantly increased.

As an example, a high-flux blue (470 nm) illuminator LED (Shark series) emitter by Opto Technology may be used. The density of phosphor layer 12 may be in the range of 4-8 mg/cm$^2$ (other densities are also contemplated), the length of cylindrical optic 10 may be in the range of 2 to 4 inches, and the diameter of the cylindrical optic may be about 0.5 inches. As another example, a different package efficiency and uniformity may be achieved by changing the phosphor-layer density, and the length and diameter of the cylindrical optic. Better efficiency and uniformity of light along the circumference of the cylindrical optic may be achieved when the cylindrical optic is 2.25 inches long.

The embodiment shown in FIG. 2 may be formed from half-round acrylic rod segments that are cut from a fully-round acrylic rod and polished. Phosphor may be mixed with optically clear epoxy and then spread uniformly on the flat surface of each rod segment. The rod segments may then be attached together and put into an oven to cure the epoxy.

The overall emission loss for a 2.25 inch optical element (cylindrical optic) was found to be approximately 16%. The losses included: 6% light reflected back to the LED, 7% Fresnel loss, and 3% irrecoverable loss due to mounting hardware.

Approximately half of the losses may be attributed to the Fresnel loss, which occurs at the boundaries between media having different refractive indices. Fresnel losses may be reduced by using a coupling mechanism between the LEDs/RCLEDs and the cylindrical optic. In addition, losses may be recovered by using an anti-reflective coating on the LEDs/RCLEDs to prevent light from reflecting back to the LEDs/RCLEDs.

FIG. 3 is a cross-sectional view of the cylindrical optic, at the bottom portion, designated as 14. As shown, cylindrical optic 10 includes two half-round acrylic rod segments 14a and 14b. Phosphor layer 12 is sandwiched between acrylic rod segment 14a and acrylic rod segment 14b. Each acrylic rod segment includes short wavelength radiation emitting sources 17 and 19. Short wavelength radiation emitting sources 17 and 19 may each be a semiconductor short wavelength radiation emitting diode, such as a light emitting diode (LED), a laser diode (LD), or a resonant cavity LED (RCLED). It will be understood that one or more than two light emitting sources may be included in bottom portion 14. As such, there may be an array of multiple light emitters disposed within acrylic rod segment 14a and another array of multiple light emitters disposed within acrylic rod segment 14b. These arrays may be arranged symmetrically with respect to each other, in a manner that is similar to light sources 17 and 19, which are shown disposed symmetrically about phosphor layer 12 of FIG. 3.

Figure 2A:
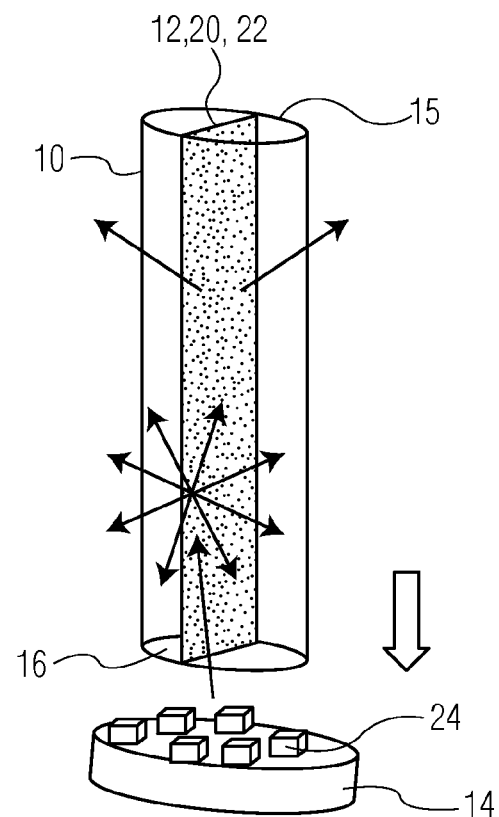
FIG. 2A is an alternative embodiment of a high efficiency light source that uses multiple colored light emitting sources and down conversion material.
Figure 2B:
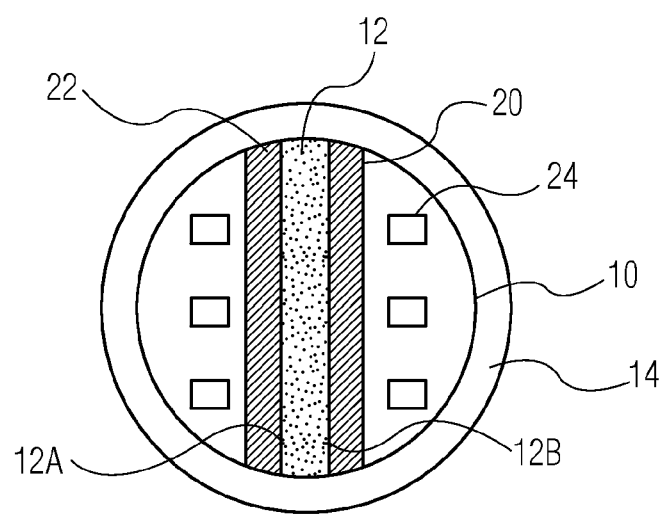
FIG. 2B is a cross-sectional view of a bottom portion of the high efficiency light source shown in FIG. 2A.

FIGS. 2A and 2B illustrate another embodiment of the present invention having the distributing optic, light transmissive enclosure 10. FIG. 2A is an alternative embodiment of a high efficiency light source that uses multiple colored light emitting sources and down conversion material. FIG. 2B is a cross-sectional view of a bottom portion of the high efficiency light source shown in FIG. 2A.

In one exemplary embodiment, down conversion material 12 may be sandwiched between two diffuser layers 20 and 22. The embodiment illustrated in these figures also uses the SPE™ technique. In this embodiment, and in all embodiments disclosed herein, the down conversion material 12 may comprise one or more phosphors such as YAG:Ce; YAG:ce phosphor plus Eu phosphor; YAG:Ce phosphor plus cadmium-selenide (CdSe); or other types of quantum dots created from other materials including lead (Pb) and Silicon (Si); and other phosphors that have been identified in a copending PCT application filed on Jun. 20, 2006 Ser. No. PCT/US06/24210. In other alternative embodiments, the phosphor layer may comprise other phosphors, quantum dots, quantum dot crystals, quantum dot nano crystals, or other down-conversion materials. In any embodiment or alternative embodiment, the down conversion region may be a down conversion crystal instead of a powdered material mixed into a binding medium.

One or both of the diffuser layers 20, 22 may be a microlens layer or micro or nano scattering particles diffused in polymer or other material having the characteristics of beam control for the forward transferred and back transferred radiation. Both the phosphor layer 12 and the diffuser layers 20 and 22 may be embedded in the middle section of the distributing optic 10, as if splitting the distributing optic 10 into substantially two equal pieces, or portions. That is, the phosphor layer 12 and the diffuser layers 20, 22 may be substantially parallel to a longitudinal axis of the distributing optic 10. In an alternative embodiment, neither the phosphor layer 12 nor the diffuser layers 20, 22 need to be embedded. In an exemplary embodiment, the phosphor layer 12 may be bonded to the diffuser layers 20, 22. In an alternative embodiment, the phosphor layer 12 need not be bonded to the diffuser layers 20, 22.

Phosphor layer 12 and diffuser layers 20, 22 need not have the rectangular shape illustrated in FIGS. 2A and 2B. In alternative embodiments, the diffuses layers 20, 22 may be curved, round, square, triangular, or other shapes. In addition, their shapes may change along the longitudinal axis of the distributive optic 10. Furthermore, the respective sizes (respective lengths or widths) of the phosphor layer 12 and the diffuser layers 20, 22 need not be the same. For example, the length or width of the phosphor layer 12 may be different than one or both of the diffuser layers 20, 22.

In yet another alternative embodiment, a single diffuser layer may be disposed in between two phosphor layers. In still another alternative embodiment, a diffuser layer may be disposed in the distributing optic without any phosphor layer.

A radiation source 24 may comprise a plurality of light emitting sources that may emit multiple color radiation. That is, each of the plurality of light emitting sources may exhibit a spectrum that is different from a spectrum of at least one of the other light emitting sources. Each of the light emitting sources 24 may be one or more LEDs, or one or more LDs (laser diode), or one or more RCLEDs. Any of the embodiments described herein may be one or more of these types of diodes. The plurality of multiple colored light emitting sources 24 may be mounted on a board or substrate 14 so that the LEDs 24 are disposed within the confines of the distributing optic 10 when the distributing optic 10 is mounted on the board 14. That is, the multi-colored LEDs 24 may be placed on board 14 so that they are inside the distributing optic 10 when the bottom of the distributing optic 10 is mounted on board 14.

In this exemplary embodiment, and in all of the embodiments disclosed in this application, individual ones of the LEDs 24 may exhibit one or more of the colors red, green, and blue. For example, if three LEDs are used in this embodiment, one LED may emit red light, a second LED may emit green light, and the third LED may emit blue light. That is, each of the LEDs (sometimes referred to as chips) may produce its own respective narrow band of radiation, or may produce both narrow bands and wide bands of radiation. In an alternative embodiment, one or more of the LEDs may display a color other than red, green, or blue. Although FIGS. 2A and 2B illustrate three LEDs, alternative embodiments may use fewer or more LEDs. In addition, the number of LEDs placed on each side of the phosphor layer 12 may be the same or may be different. All of the embodiments of the device may mix multiple spectra to create white light or may create various shades of colors with uniform illumination and color without reducing the overall luminous efficiency.

The colors that may be displayed by the LEDs in any embodiment may depend upon the use to which the device is put. In some embodiments, multiple colors may be used. In other embodiments, only two colors may be used. In some embodiments more than one LED may emit a particular color. Even if the multiple colored light emitting sources 24 are capable of emitting a plurality of colors, all of the colors need not be emitted in every embodiment. Instead, only some of the colors may be emitted in a particular embodiment or the hue of a particular color may be modified in ways that are known to one of ordinary skill in the art. The use of LEDs emitting different colors and the use of techniques that may modify the hue of one or more colors may enable one to dynamically change the emitted colors based upon a user's needs.

As illustrated in FIG. 2B, some of the multiple colored light emitting sources 24 may be placed adjacent a first side 12A of the phosphor layer 12 and others of the multi-colored LEDs 24 may be placed adjacent a second side 12B of the phosphor layer 12. Each of the multiple colored light emitting sources 24 may be placed at one or more predetermined distances from the phosphor layer 12.

In an alternative embodiment of FIGS. 2A and 2B, the multiple colored radiation emitting sources 24 may be placed at a location other than on board 14 or may be placed at a location other than at the bottom of the distribution optic 10. In another alternative embodiment, multi-colored LEDs may be placed adjacent both ends 15, 16 of the distributing optic 10. In yet other alternative embodiments, the phosphor layer 12 may be used without one or more of the diffuser layers 20, 22 or one or more of the diffuser layers 20, 22 may be used without phosphor layer 12.

Figure 4:
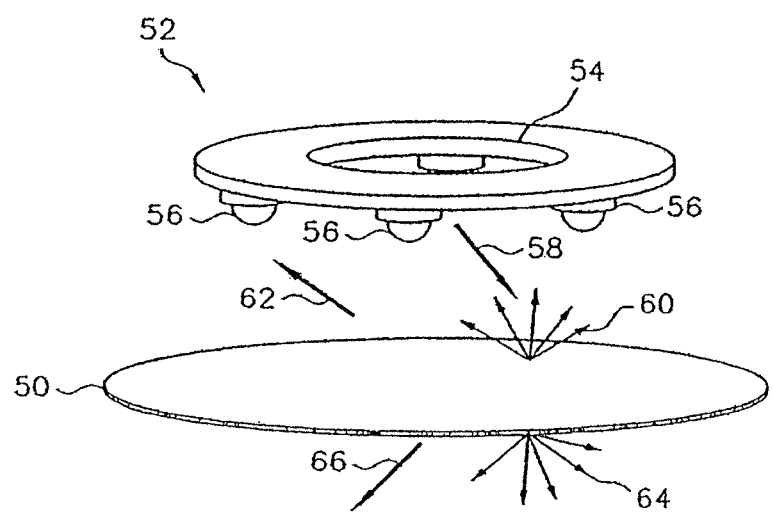
FIG. 4 illustrates another high efficiency light source that uses multiple solid state emitters and down conversion material, in accordance with another exemplary embodiment of the present invention.

FIG. 4 illustrates another exemplary embodiment of the invention using the SPE™ technique. It illustrates another high efficiency light source that may use multiple solid state emitters and down conversion material. This embodiment may be used in interior spaces where general ambient lighting is required. As shown, the device includes phosphor plate 50 (for example YAG:Ce or other phosphors, as enumerated previously). The device also includes multiple semiconductor short wavelength radiation emitting diodes 56 forming an array, such as LED/RCLED array 52. The array 52 is mounted on substrate 54 that may be of aluminum material. In an exemplary embodiment, substrate 54 may be circular. In the exemplary configuration illustrated in FIG. 4, the LEDs/RCLEDs are arranged in a spaced relation to each other and placed around the circular substrate.

The array of short wavelength radiation emitting diodes are placed on the is substrate so that the radiation emitting surfaces of the diodes face toward phosphor layer plate 50. In this manner, diodes 56 emit short wavelength radiation toward phosphor layer plate 50. As the short wavelength radiation impinges on the phosphor layer plate, the four components of radiation discussed above may be produced: short wavelength back transferred radiation and back transferred down-converted radiation 60; and short wavelength forward transferred radiation and forward transferred down-converted radiation 64. The short wavelength back transferred radiation and back transferred down converted radiation 60 produces white light 62. The forward transferred short wavelength radiation and forward transferred down-converted radiation 64 produces white light 66.

Figure 5A:
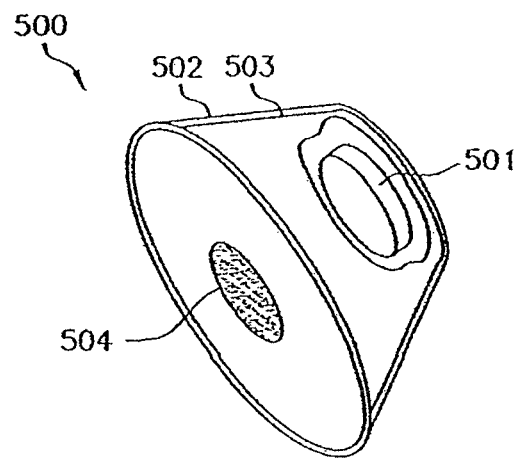
FIG. 5A is yet another embodiment of a high efficiency light source that uses solid state emitter(s) and down conversion material, in accordance with another exemplary embodiment of the present invention.
Figure 5B:
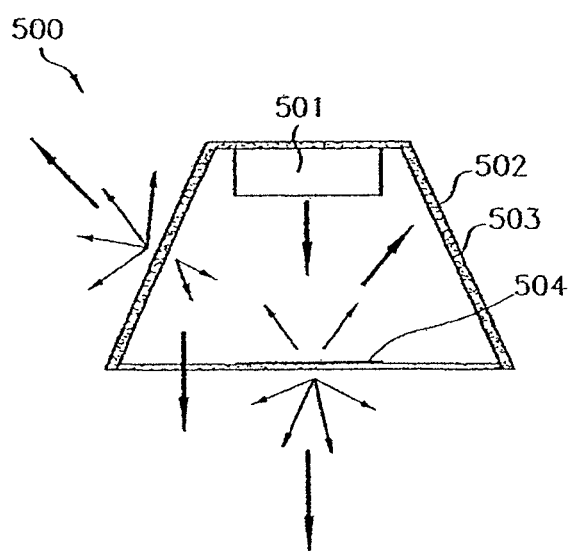
FIG. 5B is a cross-sectional view of the high efficiency light source shown in FIG. 5A.

FIGS. 5A and 5B illustrate another exemplary embodiment of the invention using the SPE™ technique. It is another embodiment of a high efficiency light source that uses solid state emitter(s) and down conversion material. FIG. 5B is a cross-sectional view of the high efficiency light source shown in FIG. 5A. As shown, device 500 includes cup 502, and one or more light emitters 501 disposed within cup 502 at a base of cup 502. Also included are phosphor layers 503 and 504.

Phosphor layer 504 is disposed at the opposite end from the base of light emitter 501 and at a substantial center from the walls of cup 502. Phosphor layer 503 is deposited on the inside of the walls of cup 502. The embodiment shown in FIGS. 5A and 56 may be used in interior spaces where general ambient lighting is required.

The device 500 includes cup 502 which may be a transparent cup having one LED/RCLED or multiple LEDs/RCLEDs emitting short wavelength radiation arranged in an array. The cup includes one phosphor layer 503 bonded to the inside transparent wall of cup 502. The other phosphor layer 504 may be bonded only at the center area of the cup. Accordingly, most of the back transferred short wavelength radiation and back transferred down-converted radiation may exit directly from the transparent portion of the front surface. Narrow beams of emitted light from the LED/RCLED are preferred in this embodiment to minimize short wavelength radiation from the LED/RCLED directly exiting the transparent portion of the front surface without impinging on the phosphor layer. The cup may be made of glass or acrylic.

The inside portion of cup 502 may be filled with glass or acrylic material, thereby sandwiching phosphor layer 503 between cup 502 and the inside portion contained within cup 502. Phosphor layer 504 may also be bonded onto the exterior surface of the glass or acrylic material. In an alternate embodiment, phosphor layer 504 may be placed within the glass or acrylic material, in a manner similar to that described for the phosphor layer sandwiched between two half-round acrylic rods, shown in FIGS. 2 and 3.

Figure 6:
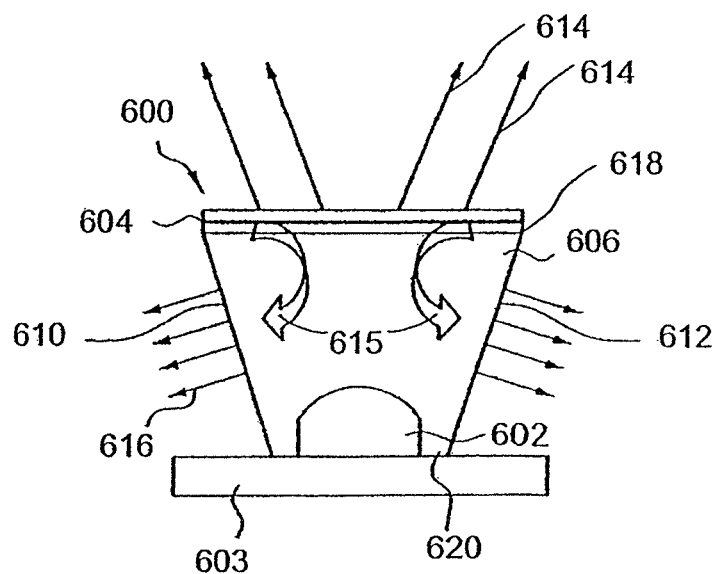
FIG. 6 is an illustration of still another high efficiency light source that uses solid state emitter(s) and down conversion material, in accordance with an exemplary embodiment of the present invention.

FIG. 6 illustrates yet another exemplary embodiment of the invention using the SPE™ technique. It illustrates another high efficiency light source that uses solid state emitter(s) and down conversion material. It illustrates an optic device making use of a down conversion material that is remote from a short wavelength radiation emitter. The down conversion material may be a phosphor. As shown, device 600 includes short wavelength radiation emitter 602 separated from phosphor layer 604 by optic device 606 which may be made of a substantially transparent medium that may be substantially light transmissive. In an exemplary embodiment, the substantially transparent medium may be air. In an alternative embodiment, the substantially transparent medium may be glass or acrylic. Phosphor (or quantum dot) layer 604 may be mounted or deposited on a portion of optic device 606 having substantially transparent and substantially light transmissive walls 610 and 612. Phosphor (or quantum dot) layer 604 may include additional scattering particles (such as micro spheres) to improve mixing light of different wavelengths. Also, the phosphor (or quantum dot) layer 604 may be of single phosphor (or quantum dot) or multiple phosphors (or quantum dots) to produce different colored down-converted radiation that may be in several different spectral regions. Alternatively, a layer with scattering particles only may be placed above, or below, or above and below the down conversion material layer to improve color mixing.

In an exemplary embodiment, the portion of optic device 606 upon which phosphor layer 604 may be deposited may be an end 618 of optic device 606. Radiation emitter 602 may be located at another portion of optic device 606. In an exemplary embodiment, radiation emitter 602 may be located at another end 620 of optic device 606. Each of walls 610 and 612 of optic device 606 may be a continuous wall, if optic device 606 has a circular cross-section.

Short wavelength radiation emitter 602 may be located between walls 610 and 612. Both the short wavelength radiation emitter 602 and the optic device 606 may be positioned on a base 603. Radiation rays 614 may comprise radiation transmitted through phosphor layer 604 including forward transferred short-wavelength radiation transmitted though the phosphor layer 604 and forward down-converted radiation transmitted through the phosphor layer 604.

Exemplary radiation rays 615 may comprise back transferred short-wavelength radiation and back transferred down-converted reflected radiation that may be emitted and/or scattered back by phosphor layer 604. Radiation rays 616 may comprise the radiation scattered back by phosphor layer 604. Radiation rays 616 may comprise the radiation rays 615 that may be transmitted through the substantially transparent, substantially light transmissive walls 610 and 612. Although exemplary arrows 615 show back transferred radiation being transferred around the middle of side walls 610 and 612, it will be understood that back transferred radiation may be transferred through side walls 610 and 612 at multiple locations along the side walls 610 and 612. The transfer of radiation outside the optic device 606 may be referred to as extraction of light. Accordingly, both radiation rays 615 and radiation rays 616 may include short-wavelength radiation reflected from the phosphor layer 604 and down-converted reflected radiation that may be emitted and/or scattered from the phosphor layer 604. Radiation rays 616 may also include radiation from radiation emitter 602. In an exemplary embodiment, some or all of radiation rays 615 and/or 616 may be seen as visible light.

The transfer (extraction) of radiation through side walls 610 and 612 to the outside of optic device 606 may occur because optic device 606 may be configured and designed with substantially transparent, substantially light transmissive walls 610 and 612 to extract radiation from inside optic device 606 to outside optic device 606. In addition, various widths of optic device 606 may be varied in order to extract a desired amount of radiation out of the optic device 606. The widths that may be varied are the width at the end 618 and the width at the end 620. Similarly, widths of optic device between end 618 and end 620 may be varied. The variation of widths of optic device 606 between ends 618 and 620 may be effected by walls 610 and 612 being substantially straight, curved, or having both straight and curved portions.

The dimensions of the features of the optic device 606 discussed above may be varied depending upon the application to which the optic device 606 may be used. The dimensions of the features of optic device 606 may be varied, and set, by using the principles of ray tracing and the principles of total internal reflection (TIR). When principles of TIR are applied, reflectivity of radiation off of one or both of walls 610 and 612 may exceed 99.9%. The principles of TIR may be applied to all of the embodiments disclosed in this application.

In one embodiment of optic device 606, for example, the dimensions of optic device 606 may be set in order to maximize the amount of the radiation from radiation source 602 that enters into optic device 606. In another embodiment, the dimensions of optic device 606 may be set in order to maximize the amount of radiation from radiation source 602 that impinges upon down conversion material 604. In yet another embodiment, the dimensions of optic device 606 may be set in order to maximize the amount of radiation that is back transferred from down conversion material 604. In still another embodiment, the dimensions of optic device 606 may be set in order to maximize the amount of radiation that is extracted through walls 610 and 612. In another embodiment, the dimensions of optic device 606 may be set in order to provide a device that, to the extent possible, simultaneously maximizes each of the radiation features discussed above: the amount of radiation entering into optic device 606; the amount the amount of radiation that impinges upon down conversion material 604; the amount of radiation that is back transferred from down conversion material 604; and the amount of radiation that is extracted through walls 610 and 612. In still another embodiment, the dimensions of optic device 606 may be set so that any or all of the features discussed above are not maximized. The principles of ray tracing and the principles of TIR may be used in order to implement any of these embodiments.

The principles discussed with respect to the embodiment illustrated in FIG. 6 may also be applied to all of the embodiments illustrated and discussed herein.

As indicated above, radiation source 602 may be an LED, an RCLED, or a laser diode (LD). If an LD is used as radiation source 602, all of the radiation from the LD may directed to, and may impinge upon, the down conversion layer 604. Accordingly, when an LD is used, the shape of the optic device 606 may be in the shape of a cylinder because substantially none of the back transferred radiation may bounce back toward the LD and substantially all of the back transferred radiation may be extracted through the sides of the cylinder.

Figure 7:
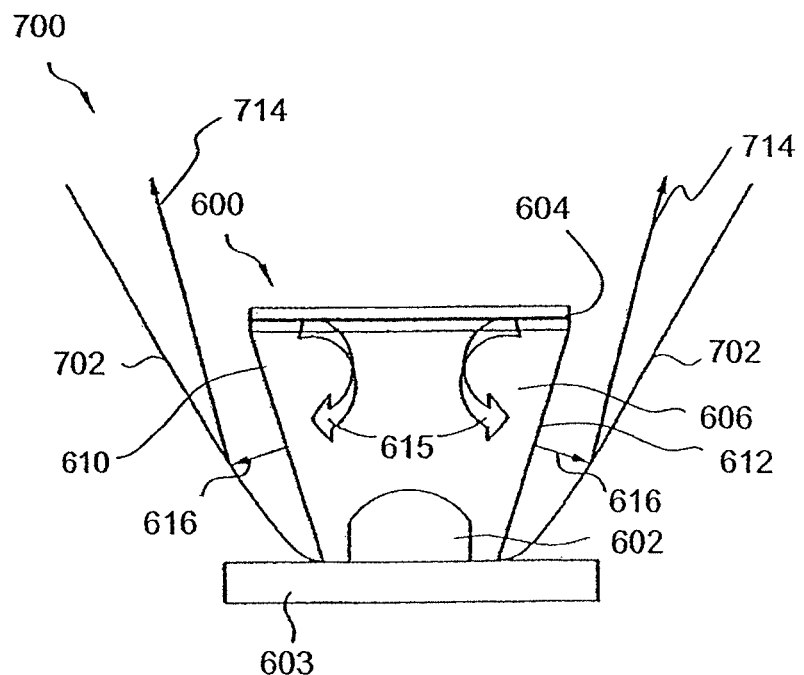
FIG. 7 depicts a reflector surrounding the high efficiency light source shown in FIG. 6, for redirecting the rays emitted from the light source(s)

FIG. 7 illustrates yet another exemplary embodiment of the invention using the SPE™ technique. FIG. 7 depicts a reflector at least partially surrounding the high efficiency light source shown in FIG. 6, for redirecting the rays emitted from the light source(s). As shown, device 700 includes device 600 disposed within reflector 702. Reflector 702 has a geometric shape of a parabola for illustration purposes. The invention is not so limited in that reflector 702 may have other geometrical shapes, such as a cone, a sphere, a hyperbola, an ellipse, a pyramid, or may be box-shaped, for example. Advantages of device 700 may include better control of the beam output distribution and better uniform output of the color. Whenever a reflector is illustrated in any of the embodiments disclosed herein, the shape of the reflector may be any of these shapes.

Substrate 603 may be used for mounting the short wavelength radiation emitting source (602), one end of optic 606, and one end of reflector 702, as shown in FIGS. 6 and 7.

Light rays 616 may impinge on reflector 702 which may redirect them forward as light rays 714. Advantageously, the direction of light rays 714 are desirably generally in the same direction as radiation rays that may be transmitted through the phosphor layer. Consequently, the total light output of the device 700 may be a combination of radiation transmitted through the phosphor layer and light rays 714. As indicated in the discussion of the embodiment illustrated in FIG. 6, the principles of TIR may also be applied to the embodiment illustrated in FIG. 7. Light that escapes from optic device 606 may be captured by reflector 702. Some of the light captured by reflector 702 may be redirected by reflector 702 in the direction generally indicated by arrow 714 and some of the light may be redirected back into optic device 606. The effects described herein of combining the principles of TIR with the use of a reflector may apply to all embodiments illustrated in this application that use a reflector.

Similar to the other embodiments of the invention, short wavelength radiation emitting source 602 may be one or multiple semiconductor short wavelength radiation emitting diodes, such as an LED, LD or RCLED. The short wavelength radiation emitting to diodes may be mounted in an array of diodes, similar to the array of light sources depicted as array 52 in FIG. 4. In addition, phosphor layer 604 may be similar to phosphor layer 50 depicted in FIG. 4.

Figure 7A:
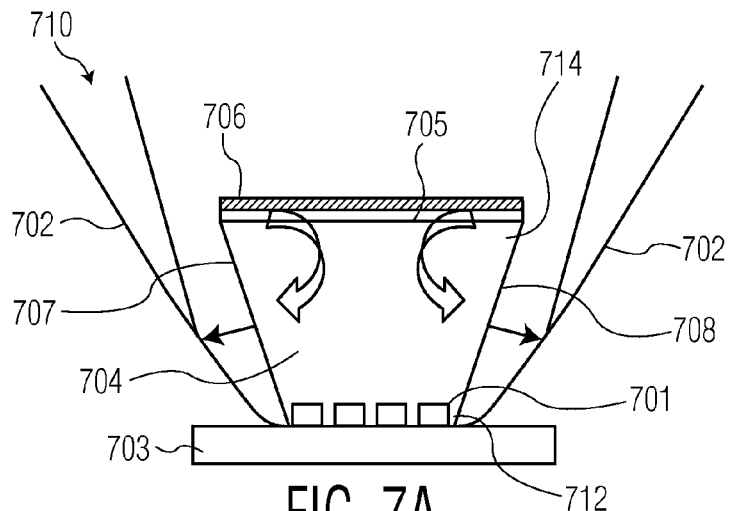
FIG. 7A illustrates another exemplary embodiment of the invention using multiple colored light emitting sources.

FIG. 7A illustrates another exemplary embodiment of the invention using the SPE™ technique. The exemplary embodiment illustrated in FIG. 7A uses multiple colored radiation emitting sources. As shown, device 710 includes optic device 704 disposed within reflector 702. Optic device 704 may have substantially transparent walls 707 and 708. Down conversion material layer 706 and diffuser layer 705 may be mounted or deposited on a portion of optic device 704 that may be an end 714 of optic device 704. Reflector 702 may be used to control the output beam distribution of the device 710 as well as to achieve uniform color output from the device 710. Optic device 704 and reflector 702 may both be mounted onto substrate 703. Substrate 703 may provide an electrical connection and/or heat dissipation for light sources. In an alternative embodiment, optic device 704 may be used without reflector 702.

The embodiment illustrated in FIG. 7A may have multiple colored radiation emitting sources 701. The nature of the multiple colored radiation emitting sources 701 may be the same as described elsewhere in this application with respect to other embodiments of this invention. The multiple colored radiation emitting sources 701 may be located on a portion of the optic device 704 that may be at an end 712 of the optic device 704. As stated, down conversion material layer 706 and a diffuser layer 705 may be located at another end 714 of the optic device 704. The characteristics of the down conversion material layer 706, the characteristics of the diffuser layer 705, and the number of layers comprising the down conversion material layer 706 and the diffuser layer 705 may be the same as described elsewhere in this application with respect to other embodiments of this invention. As described elsewhere in this application, for example, the down conversion material layer 706 may be a phosphor layer. The optic device 704 may be a substantially transparent medium or other medium described elsewhere in this application with respect to other embodiments of this invention. For example, optic device 704 may be made of glass, or acrylic, or polymer, or silicon or any other material that is substantially light transmissive.

It will be understood by those skilled in the art that phosphor layer 706 may also affect light in the same way that a diffuser layer affects light by providing uniformity to the light. That is, phosphor layer 706 may also function as a diffuser. The additional diffuser layer 705 therefore may make the light more uniform than the light may be if a phosphor layer 706 is used alone. In other embodiments, the positions of the phosphor layer 706 and the diffuser layer 705 can be switched. That is, phosphor layer 706 may be located on top of the optic device 704 and diffuser layer 705 may be located on top of the phosphor layer 706. In yet another embodiment, phosphor layer 706 may be used without diffuser layer 705. In still another embodiment, diffuser layer 705 may be used without phosphor layer 706. Regardless of whether a phosphor is used alone, a diffuser is used alone, or both a phosphor and a diffuser are used together, the purpose of using one or both of them may be to provide uniformity to the light and uniformity to any colors that may be emitted by the radiation emitting sources 701.

Figure 7B:
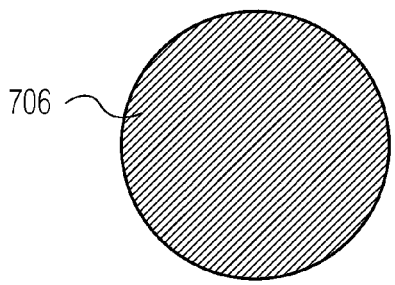
FIG. 7B illustrates a down conversion material dispersed in a down conversion material layer in accordance with an exemplary embodiment of the present invention.
Figure 7C:
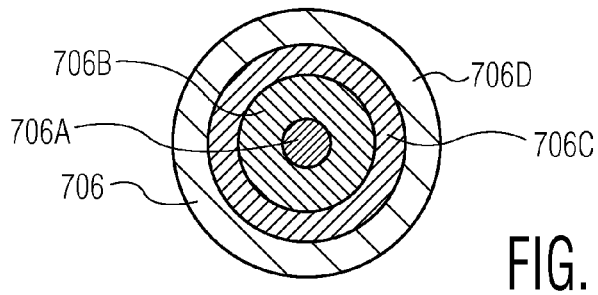
FIG. 7C illustrates a down conversion material dispersed in a down conversion material layer in accordance with an alternative embodiment of the present invention.
Figure 7D:
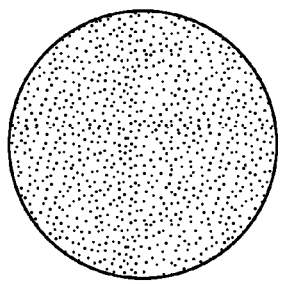
FIG. 7D illustrates a down conversion material dispersed in a down conversion material layer in accordance with another alternative embodiment of the present invention.

FIGS. 7B-7D illustrate different ways of dispersing the down conversion material 706 used in the embodiment illustrated in FIG. 7A and with all of the other embodiments illustrated herein. As illustrated in FIG. 7B, down conversion materials such as phosphor may be uniformly dispersed within the down conversion material layer 706.

As illustrated in FIG. 7C, the down conversion material layer 706 may comprise a plurality of down conversion materials. Each one of the plurality of down conversion materials may have different densities of down conversion materials depending on the distance from the center of the layer of down conversion material. For example, down conversion material layer 706 may have four segments, each of the segments have a different density. A first segment of down conversion material 706A having a first density of down conversion material may be at the center of the down conversion material layer 706. A second segment of down conversion material 706B having a second density of down conversion material may surround the first segment of down conversion material 706A. A third segment of down conversion material 706C having a third density of down conversion material may surround the second segment of down conversion material 706B. A fourth segment of down conversion material 706D having a fourth density of down conversion material may surround the third segment of down conversion material 706C. Although each of the aforesaid segments of down conversion material are shown as having a circular shape, each of the segments may each have different shapes. For example, they could be in the shape of a square, a triangle, or other polygonal shape or any shape other than polygonal. In addition, more or fewer segments of down conversion material may be used.

A different way of dispersing down conversion material is illustrated in FIG. 7D. As shown in FIG. 7D, specs or "sesame dots" (that is, small pieces) of down conversion material may be dispersed about the secondary optic device. For example, the specs of down conversion material may be deposited on top of the secondary optic device 708 or may be embedded within the top surface at end 714 of the secondary optic device 704. The specs of down conversion material may be randomly dispersed or may be dispersed in a predetermined pattern.

The embodiments of a phosphor disclosed in FIGS. 7B to 7D along with other embodiments of phosphors discussed elsewhere in this application may be used to adjust phosphor density in order to obtain a desired color and hue. Such adjustments may be made with any embodiment disclosed in this application whether the embodiment is intended to produce white light or light of a particular color. For example, an embodiment may use a mixture of blue and yellow phosphors. An alternative embodiment may use a mixture of multiple kinds of phosphors such as quantum dots, quantum dot crystals, and quantum dot nano crystals. Still other embodiments may use a blue LED either with a single phosphor or a blue LED with multiple phosphors in order to obtain different tones of white light. Still other embodiments may use multiple color LEDs with a diffuser. Additional embodiments may use any combination of these features.

As indicated elsewhere in this application, respective ones of the radiation emitting sources 701 may emit blue light, green light, or red light in any combination. Different hues of each color may also be used. If one or more of the radiation emitting sources 701 emits blue light, and if the layer 706 is a phosphor, the blue light may be down converted as described elsewhere in this application resulting in the four components of radiation described elsewhere in this application. If one or more of the radiation emitting sources 701 emits blue light, and if the layer 706 is not a phosphor but is a different kind of diffuser material, the blue light impinging on the layer 706 may not be down converted. If one or more of the radiation emitting sources 701 emits red light or emits green light, or emits light of any color other than blue, such light may not be down converted whether layer 706 is a phosphor material or other diffuser material. If blue light, green light, and red light all impinge on layer 706 when a phosphor is used, white light may result depending upon the density of the phosphor.

Regardless of what colors are respectively emitted by the radiation emitting sources 701, and regardless of whether a phosphor or another diffuser material is used, when light from the radiation emitting sources 701 impinges on the phosphor or other diffuser material, forward transferred radiation and back transferred radiation results. In the case of blue light impinging on a phosphor layer, the resulting components of radiation may be as described with respect to FIG. 14. In the case of other colors impinging on a phosphor layer, the forward transferred light and the back transferred light may be the same color as the impinging light. For example, if red light impinges on phosphor layer 706, the forward transferred light and the back transferred light may also be red light. The same result would obtain with green light, or any other color besides blue. The same results may obtain if a diffuser material other than phosphor is used.

Figure 8A:
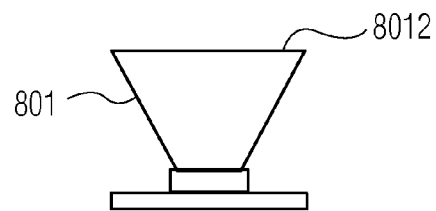
FIGS. 8A through 8E illustrate various geometric shapes for the optical element, or optical lens, disposed immediately above an exemplary light emitting source, in accordance with different exemplary embodiments of the present invention.
Figure 8B:
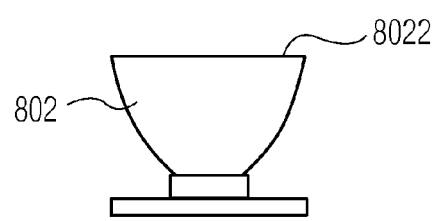
Figure 8C:
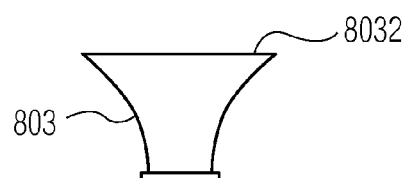
Figure 8D:
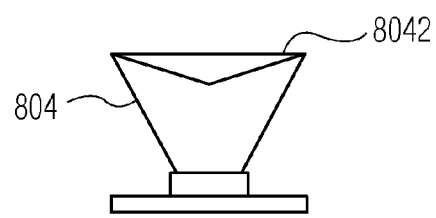
Figure 8E:
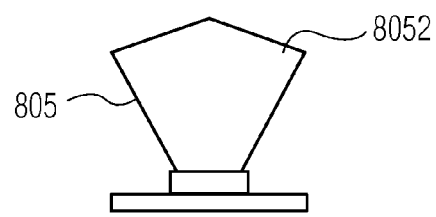

FIGS. 8A through 8E depict different cross-section shapes of the optic element that may be used with the embodiments of the SPE™ technique described herein. Optic element 801 illustrated in FIG. 8A is of a conical geometry having a top surface 8012. Alternative optic element 802 illustrated in FIG. 8B is of a spherical geometry having a top surface 8022. Alternative optic element 803 illustrated in FIG. 8C is of a hyperbolic geometry having a top surface 8032. Alternative optic element 804 illustrated in FIG. 8D may have conical walls and a concave top surface 8042. Alternative optic element 805 illustrated in FIG. 8E may have conical walls and a convex top surface 8052. Other geometrical shapes may include a parabolic or elliptical shape. In addition, the top of the wider surface of each optical element may be flat, or may have another geometrical shape.

Similar to the other embodiments, optic elements 801 through 805 may be made of a substantially transparent material, thereby functioning like an optical lens (similar to optic device 606 of FIG. 6).

Although not shown in FIGS. 8A to 8E, a reflector (similar to reflector 702, shown in FIG. 7) may be positioned to surround each optical element 801 through 805. Furthermore, each optical element 801 through 805 may include a down-conversion material layer and a diffuser layer (similar to phosphor layer 706 and diffuser layer 705 shown in FIG. 7A). This phosphor layer and diffuser layer (not shown in FIGS. 8A to 8E) may be deposited on top one of the respective top surfaces 8012, 8022, 8032, 8042, 8052 of each optical element, opposite to its respective light emitting source. Alternatively, this phosphor layer and diffuser layer (not shown in FIGS. 8A to 8E) may be sandwiched within each optical element, near one of the respective top surfaces 8012, 8022, 8032, 8042, 8052 of the respective optical elements and opposite to its respective light emitting source. In other embodiments, as discussed with respect to FIG. 7A, the positions of the phosphor layer 706 and the diffuser layer (not shown in FIGS. 8A to 8E) be switched. That is, phosphor layer 706 may be located on top of a respective one of the optic devices 801, 802, 803, 804, 805 and a diffuser layer (not shown in FIGS. 8A to 8E) may be located on top of the phosphor layer 706. In yet another embodiment, phosphor layer 706 may be used without a diffuser layer. In still another embodiment, a diffuser layer (not shown in FIGS. 8A to 8E) may be used without phosphor layer 706.

Figure 8F:
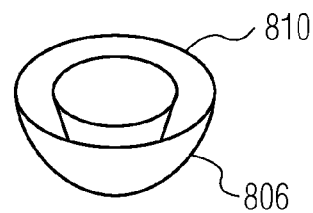
FIGS. 8F and 8G illustrate other embodiments of a reflector and an optic device.
Figure 8G:
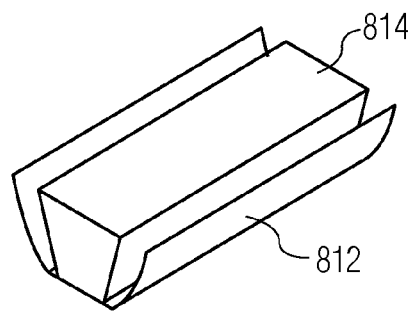

FIGS. 8F and 8G illustrate the embodiments of invention using the SPE™ technique includes respective radiation sources, respective reflectors, and an optic device that may exhibit one of the cross-section shapes 801 through 805 illustrated in FIGS. 8A to 8E. In FIG. 8F, a reflector 806 and a secondary optic device 810 are both revolved objects with a common central axis (not shown). In FIG. 8G, a reflector 812 and an optic device 814 are both extruded along their respective long axis. The sectional view of reflectors 806 and 812 may have a cross-section shape of a parabola, or other geometrical shapes, such as a cone, a sphere, a hyperbola, an ellipse, a pyramid, or may be box-shaped, for example.

Figure 9A:
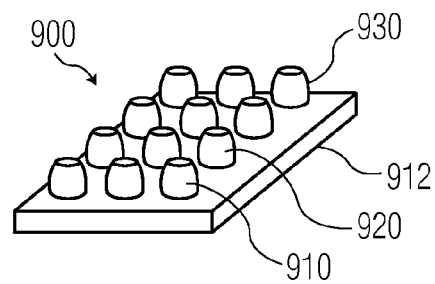
FIG. 9A shows a device having multiple high-efficiency light sources that use solid state emitter(s) and down conversion material placed on a lightpipe for redirecting the light rays from the light sources, in accordance with an exemplary embodiment of the present invention.
Figure 9B:
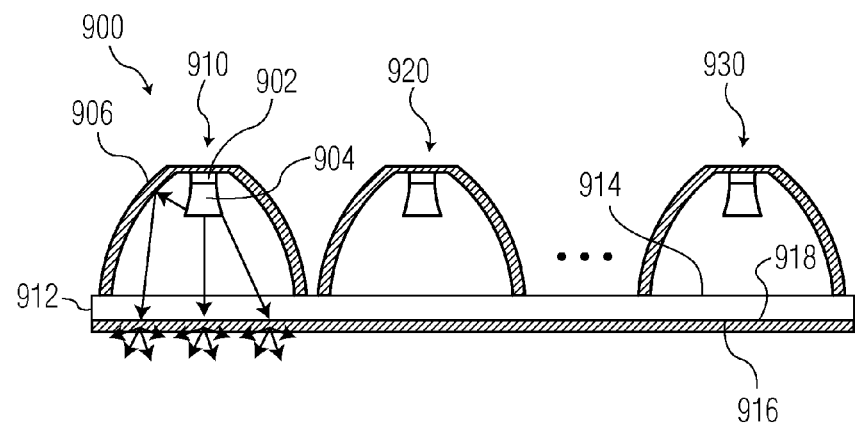
FIG. 9B is a cross-sectional view of the device shown in FIG. 9A.

Referring next to FIGS. 9A and 9B, there is shown a two dimensional linear array of lenses, generally designated as 900. As shown in FIG. 9A, an array of N×M high efficiency light source devices are arranged on top of a lightpipe 912. Although lightpipe 912 is illustrated in FIG. 9A as having a rectangular shape, it will be understood that it may have a shape other than rectangular. Three of the exemplary light source devices are designated as 910, 920 and 930. The remaining light source devices in the N×M array may be identical to any one of the light source devices 910, 920, or 930. In alternative embodiments, lightpipe 912 may have a circular shape or another shape. Also in alternative embodiments, the array of lenses may have a radial placement or may be placed in other patterns.

As best shown in FIG. 9B, each of light source devices 910, 920, 930 may include radiation emitter 902, lens 904 such as optic device 606 and a phosphor layer (not shown), which may be similar to phosphor layer 604 of FIG. 6. Also included may be a reflector 906, which may redirect transmitted and reflected light from radiation emitter 902 towards lightpipe 912.

Lightpipe 912, as shown, may include side 914 abutting light source devices 910, 920, and 930, and another opposing side 916 further away from the light source devices. On top of opposing side 916, there may be a microlens layer 918. The microlens layer may be bonded to the deposited phosphor layer.

Figure 9C:
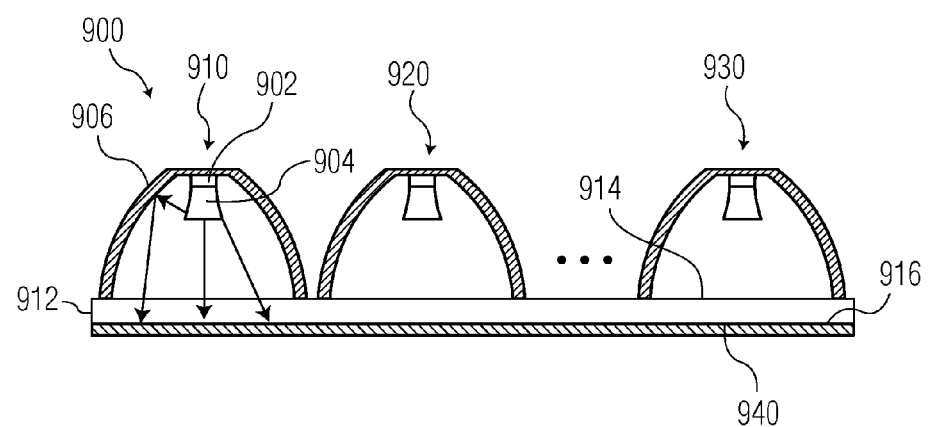
FIG. 9C illustrates a cross-section view of another alternative embodiment of the device shown in FIG. 9A that may include multiple colored light emitting sources.

As best shown in FIG. 9C, one or more of the exemplary light source devices 910, 920 and 930 may be similar to device 710 of FIG. 7A, including multiple colored light emitting sources, a lens such as optic device 704, a down conversion material layer such as layer 706, and a diffuser layer such as layer 705. For example, in this alternative embodiment, light source device 910 may include multiple colored light emitting sources 902, lens 904 such as optic device 704, a down conversion material layer (not shown), which may be similar to down conversion material layer 706 of FIG. 7A, and a diffuser layer (not shown), which may be similar to diffuser layer 705 of FIG. 7A. Also included may be a reflector 906, which may be similar to the reflector 702 of FIG. 7A. Each of the other light source devices may also have multiple colored light emitting sources, a lens such as the optic device disclosed with respect to FIG. 7A, a down conversion material layer and a diffuser layer similar to the elements contained in light source device 910. In yet another embodiment, optic device 904 may not have a down conversion material layer deposited on it.

Lightpipe 912, as shown in FIG. 9C, includes side 914 abutting exemplary light source devices 910, 920 and 930, and another opposing side 916 further away from the exemplary light source devices. On top of opposing side 916, there may be deposited microlens layer 940.

Figure 10A:
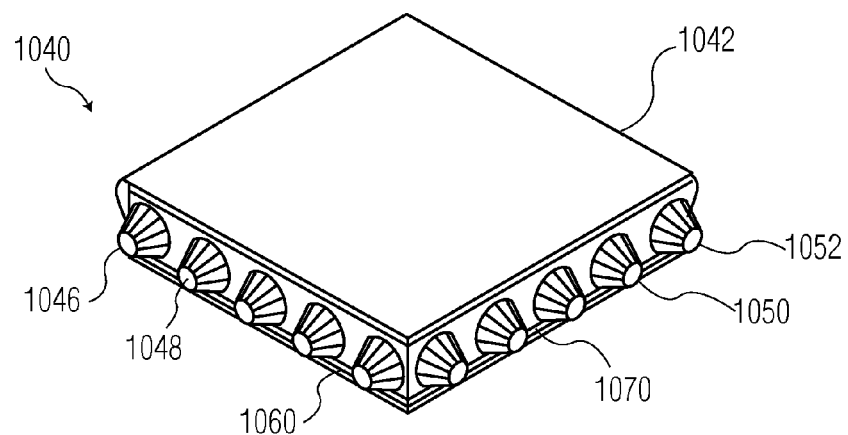
FIG. 10A is an illustration of another device having multiple high efficiency light sources that use solid state emitter(s) and down conversion material disposed around edges of a lightpipe for redirecting the light rays from the light sources, in accordance with an exemplary embodiment of the present invention.
Figure 10B:
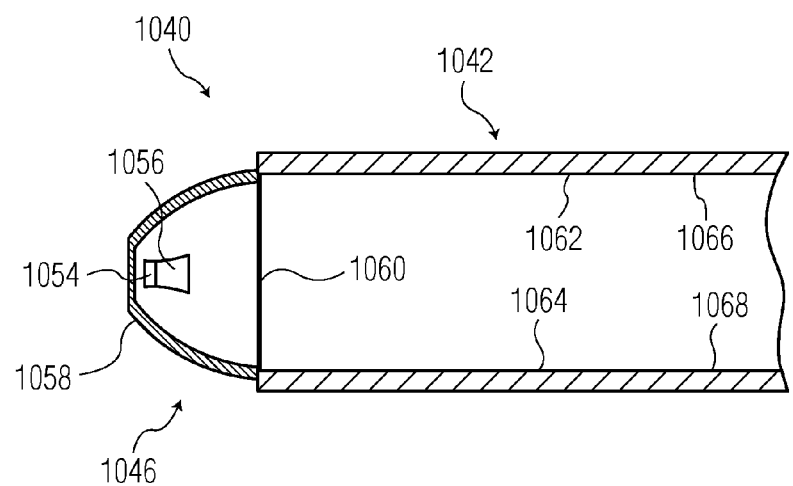
FIG. 10B is a cross-sectional view of the device shown in FIG. 10A.

FIGS. 10A and 10B illustrate another exemplary embodiment of a high efficiency light source, generally designated as 1040, in which individual light source devices may be spaced around the edges of a lightpipe 1042. As shown in FIG. 10A, several light devices, such as exemplary light source devices 1046, 1048, 1050, and 1052, etc. may be placed around the edges of lightpipe 1042.

A cross-section of exemplary high-efficient light source 1040 is shown in FIG. 10B. As shown in FIG. 10B, exemplary light source device 1046 may be configured to direct light into lightpipe 1042. Lightpipe 1042 may include a first side 1062 of light pipe 1042 and a second side 1064. A microlens layer 1066 may be placed adjacent first side 1062 of light pipe 1042 and another microlens layer 1068 may be placed adjacent second side 1064 of lightpipe 1042. Although lightpipe 1042 is illustrated as having a polygonal shape, it may also have a circular shape or other shape.

In one embodiment of the embodiment illustrated in FIGS. 10A and 10B, each of the exemplary light source devices 1046, 1048, 1050 and 1052 may be similar to device 700 of FIG. 7, including a short wavelength radiation emitter, a lens such as an optic device described herein, and a down conversion material layer. For example, exemplary light source device 1046 may be mounted onto edge 1060 of lightpipe 1042. Exemplary light source device 1046 may include short wavelength radiation emitter 1054, lens 1056 such as optic device 606, and a down conversion material layer (not shown), which may be similar to down conversion material layer 604 of FIG. 6 or similar to down conversion material layer 706 of FIG. 7A. Also included may be reflector 1058, which may redirect the back transferred radiation and forward transferred radiation from lens 1056 towards the edge 1060 of lightpipe 1042, and into lightpipe 1042. The reflector 1058 may be similar to reflector 702 of FIG. 7. Additional light source devices may be placed along edge 1060 and along edge 1070. Even more light source devices may be placed along the other two edges of lightpipe 1042 that are not shown in FIGS. 10A and 10B. All of the light source devices, other than light source device 1046, may also have a similar short wavelength radiation emitter, a lens, and a down conversion material layer similar to the elements contained in light source device 1046. It will be understood that even though FIG. 10A shows five light source devices along each of edges 1060 and 1070, fewer or more light source devices may be used along each of edges 1060 and 1070 and along the edges that are not shown in FIG. 10A.

In another alternative embodiment, one or more of the exemplary light source devices 1046, 1048, 1050 and 1052 may be similar to device 710 of FIG. 7A, including multiple colored light emitting sources, a lens such as an optic device, a down conversion material layer, and a diffuser layer. In this alternative embodiment, exemplary light source device 1046 may include multiple colored light emitting source 1054, lens 1056 such as optic device 704, a down conversion material layer (not shown), which may be similar to down conversion material layer 706 of FIG. 7A, and a diffuser layer (not shown), which may be similar to diffuser layer 705 of FIG. 7A. Each of the exemplary light source devices shown in FIG. 10A may also have a reflector such as exemplary reflector 1058, which may be similar to the reflector 702 of FIG. 7A. The reflector may re-direct light from the multiple colored light emitting sources and the back transferred light from respective down-conversion material or diffuser layer toward the edge 1060 of lightpipe 1042, and into lightpipe 1042. Each of the other light source devices may also have multiple colored light emitting sources, a lens, a down conversion material layer and a diffuser layer similar to the elements contained in light source device 1046 that may transmit their respective light into lightpipe 1042 through respective edges of lightpipe 1042. In another embodiment, optic device 1056 may not have the diffuser layer. In yet another embodiment, optic device 1056 may not have a down conversion material layer deposited on it.

On top of sides 1062 and 1064 of Lightpipe 1042, as shown in FIG. 10B, there may be deposited microlens layer 1066 and 1068.

Figure 11:
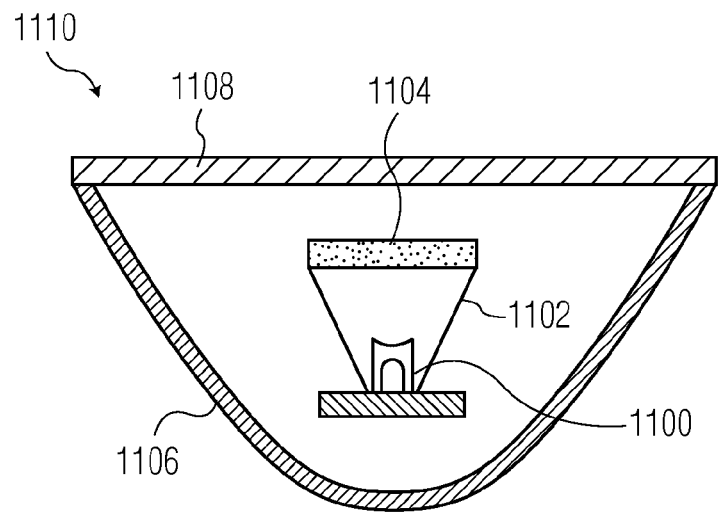
FIG. 11 is an illustration of yet another high efficiency light source arranged so that it is surrounded by a reflector and a high efficiency microlens diffuser, in accordance with an exemplary embodiment of the present invention.

FIG. 11 illustrates still another exemplary embodiment of the invention. As shown, device 1110 includes a short wavelength radiation source 1100, a lens 1102 which may be any of the optic devices described herein, and a phosphor layer 1104. The phosphor layer may be deposited on top of lens 1102, so that the phosphor layer is away from the short wavelength radiation source 1100, in a manner that is similar to that shown in FIGS. 6, 7, 7A, for example. The light source/lens/phosphor configuration may be at least partially surrounded by a reflector 1106 having a high-reflectance. In an exemplary embodiment the measured reflectance of reflector 1106 may be in the range of 90% to 97%. In addition, a high efficiency microlens diffuser 1108 may be placed across the top of reflector 1106. In an exemplary embodiment, the microlens diffuser may exhibit greater than 95% efficiency. The reflectance of other reflectors described in this application may be the same as the reflectance of reflector 1106. The efficiency of other diffusers described in this application may be the same as the efficiency of diffuser 1108.

Figure 11A:
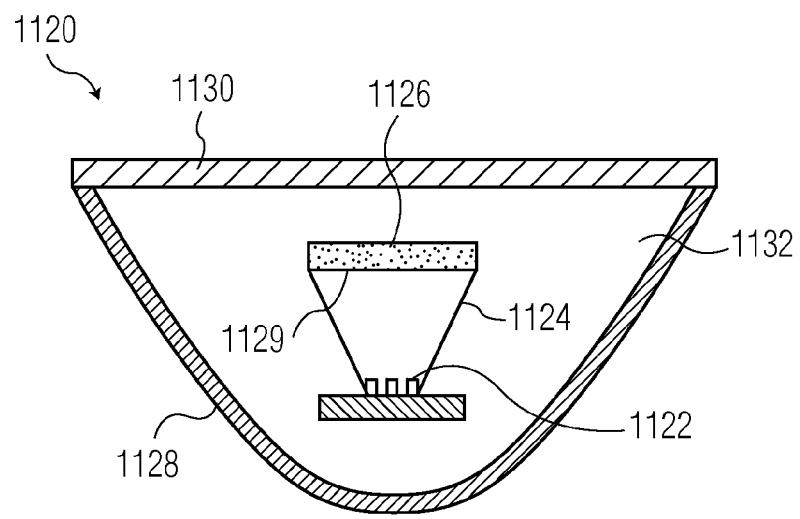
FIG. 11A is an illustration of an alternative embodiment of the embodiment illustrated in FIG. 11 that may include multiple colored light emitting sources.

FIG. 11A illustrates another embodiment of the invention. FIG. 11A shows a device 1120 which may include multiple colored radiation emitting sources 1122, an optic device 1124, and a down conversion material layer 1126. The optic device 1124 may be mounted adjacent the multiple colored radiation emitting sources 1122. The down to conversion material layer 1126 may be mounted or deposited on one portion or on one end 1129 of the optic device 1124 so that the down conversion material layer 1126 is away from the multiple colored radiation emitting devices 1122. Although FIG. 11A illustrates three multiple colored radiation emitting sources 1122, it will be understood that more or fewer multiple colored radiation emitting sources 1122 may be used for the reasons explained with respect to other embodiments illustrated in this application. The package comprising the array of multiple colored radiation emitting sources 1122, the optic device 1124, and the down conversion material layer 1126 may be at least partially surrounded by a reflector 1128 having a high reflectance. In an exemplary embodiment of this alternative embodiment, the measured reflectance of reflector 1128 may be in the range of 90% to 97%. A high efficiency microlens diffuser 1130 may be placed across end 1132 of reflector 1128. End 1132 may be open if a diffuser is not placed across it. In an exemplary embodiment, microlens diffuser 1130 may exhibit greater than 95% efficiency. In an alternative embodiment of the embodiment illustrated in FIG. 11A, a diffuser may be used in place of down conversion material layer 1126 and diffuser layer 1130 may be eliminated. In another embodiment, the side walls of optic device 1124 may be painted white in order to improve color mixing.

Figure 12:
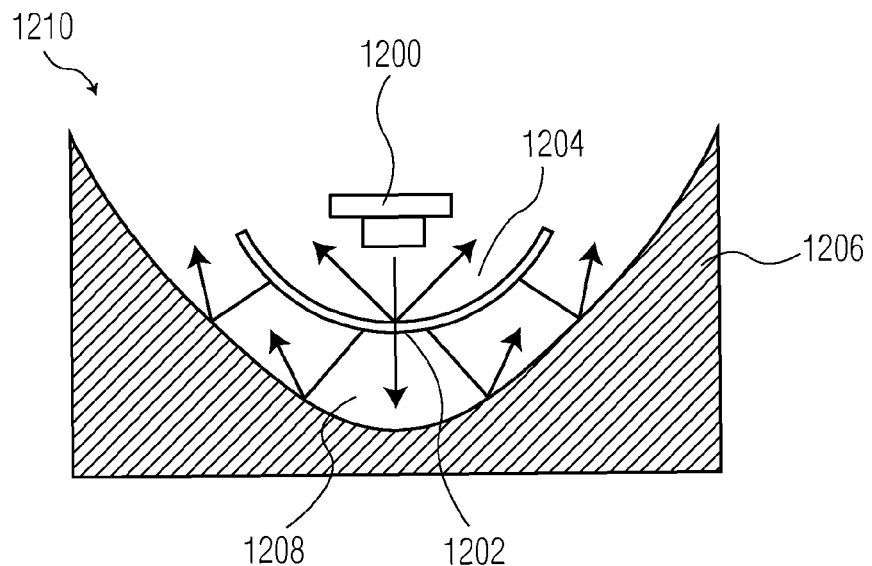
FIG. 12 is an illustration of still another high efficiency light source directing radiation towards a down conversion material and a reflector, where the down conversion material is disposed between the high efficiency light source and the reflector, in accordance with an exemplary embodiment of the present invention.

FIG. 12 illustrates yet another exemplary embodiment of the invention. As shown, device 1210 includes short wavelength radiation source 1200 facing phosphor layer 1202 and reflector 1206. A substantially transparent medium 1204 may fill the space between short wavelength radiation source 1200 and phosphor layer 1202. In an exemplary embodiment, phosphor layer 1202 may be in the shape of a parabola, or other curved shape, similar to one of the geometric shapes previously enumerated. Reflector 1206 may be spaced away from the phosphor layer 1202 and the radiation source 1200. A substantially transparent medium 1208 may be used to fill the space between the phosphor layer 1202 and the reflector 1206. As shown, phosphor layer 1202 is disposed between the light source 1200 and reflector 1206.

Figure 12A:
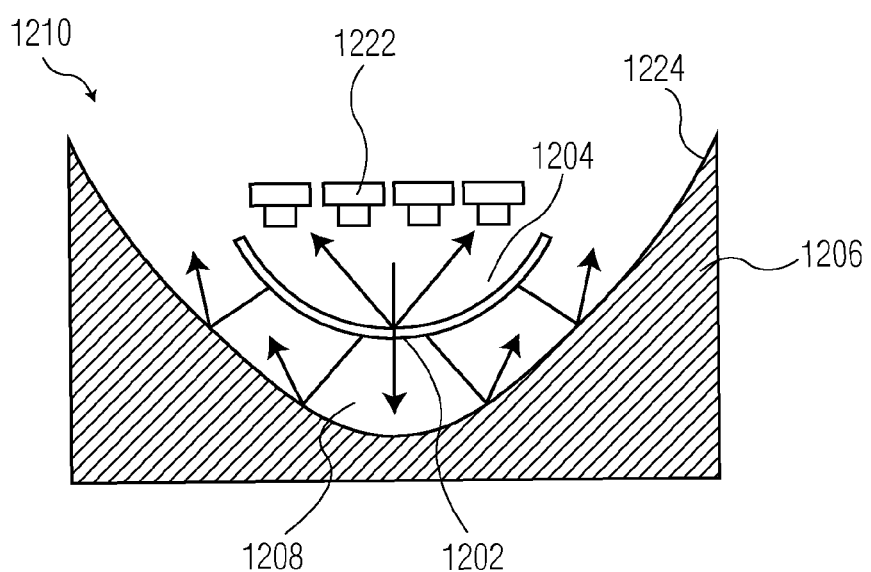
FIG. 12A is an illustration of an alternative embodiment of the embodiment illustrated in FIG. 12 that may include multiple colored light emitting sources.

FIG. 12A illustrates still another exemplary embodiment of the invention. As shown, device 1220 in FIG. 12A has a radiation source comprising multiple colored light emitting sources 1222 facing down conversion material layer such as a phosphor layer 1202 and a reflector 1206. Phosphor layer 1202 is disposed away from light emitting sources 1222. A substantially transparent medium 1204 may be positioned between multiple colored light emitting sources 1222 and down conversion material layer 1202. In an exemplary embodiment, the down conversion material layer 1202 may be in the shape of a parabola or other curved shape. Reflector 1206 may be spaced away from the down conversion material layer 1202 and the multi-colored LED array 1222. A substantially transparent medium 1208 may be present between the down conversion material layer 1202 and the reflector 1206. In this embodiment, the down conversion material layer 1202 is disposed between the light emitting sources 1222 and the reflector 1206. In an alternative embodiment, a diffuser layer may be placed across an end 1224 of reflector 1206. End 1224 may be open if a diffuser layer is not placed across it. In another alternative embodiment, a diffuser layer may be used instead of a down conversion material layer 1202. If a diffuser layer is used instead of a down conversion material layer, a diffuser layer may not be placed across end 1224.

While it is well known that the phosphor used in white light-emitting diodes (LEDs) backscatters more than half the light emitted, no one to date has shown that this light may be recovered as photons to increase the overall efficacy of a white light source. The inventors have experimentally verified a scattered photon extraction (SPE™) method provided by the various embodiments of the invention, that significantly increases the overall efficacy of a white light source. At low currents, the SPE™ package showed over 80 lm/W white light with chromaticity values very close to the blackbody locus.

Of the different methods available for creating white light, the phosphor-converted emission method is the most common. A first phosphor-converted white LED uses cerium doped yttrium aluminum garnet (YAG:Ce) phosphor in combination with a gallium nitride (GaN) based blue LED. In a typical white LED package, the phosphor is embedded inside an epoxy resin that surrounds the LED die. Some portion of the short-wavelength radiation emitted by the GaN LED is down-converted by the phosphor, and the combined light is perceived as white by the human eye. Although these products proved the white LED concept and have been used in certain niche illumination applications, they are not suited for general lighting applications because of their low overall light output and low efficacy.

To achieve higher luminous efficacy with white LEDs, improvements are needed at several stages: internal quantum efficiency, extraction efficiency, and phosphor-conversion efficiency. Some researchers have taken on the challenge of researching the materials and growth aspects of the semiconductor to improve internal quantum efficiency. Others are exploring shaped chips, photonic crystals, micron-scale LEDs, and other novel methods to improve light extraction efficiency. Still others are investigating new phosphors that have greater down-conversion efficiencies and better optical properties.

Although past literature acknowledges that a significant portion of the light is backscattered by the phosphor and lost within the LED due to absorption, to the best of the inventors' knowledge no one to date has attempted to improve performance by extracting these backscattered photons, by way of the SPE™ method, provided by the embodiments of the present invention, which significantly increases the overall light output and luminous efficacy of a phosphor-converted white LED by recovering the scattered photons.

To better understand the interaction between primary short-wavelength light and phosphor and to quantify the amount of forward and backward scattered light, several circular glass plates, 5 cm in diameter, were coated by the inventors with different densities of YAG:Ce phosphor ranging from 2 mg/cm$^2$ to 8 mg/cm$^2$. These phosphor plates were placed between two side-by-side integrating spheres with the phosphor coating facing the right sphere. The phosphor material was excited by radiation from a 5 mm blue LED placed inside the right sphere 2.5 cm away from the glass plate. A spectrometer measured the light output from each sphere through the measurement ports. Light output measured from the left and right spheres indicated the amount of light transmitted through and reflected off the phosphor layer, respectively. The spectrometer data was analyzed to determine the amount of flux in the blue and yellow regions, corresponding to the radiant energy emitted by the LED and the converted energy from the YAG:Ce phosphor. Experimental results showed that the spectral power distributions for the transmitted and reflected radiations are different, especially the amount of blue-to-yellow ratio. The amount of transmitted and reflected radiations depends on the phosphor density, with lower densities resulting in higher percentages of transmitted radiation. Typically, the phosphor density may be controlled such that the transmitted blue and yellow light are in the correct proportion to produce white light of a suitable chromaticity, which typically places it on or close to the blackbody locus. From the gathered data, it was estimated that about 40% of the light is transmitted when creating a balanced white light, and the remaining 60% is reflected. Yamada et al. found similar results, as reported in K. Yamada, Y. Imai, K. Ishii, J. Light & Vis. Env. 27(2), 70 (2003). In a conventional white LED, a significant portion of this reflected light is absorbed by the components surrounding the die, one of the reasons for its low luminous efficacy.

Figure 13:
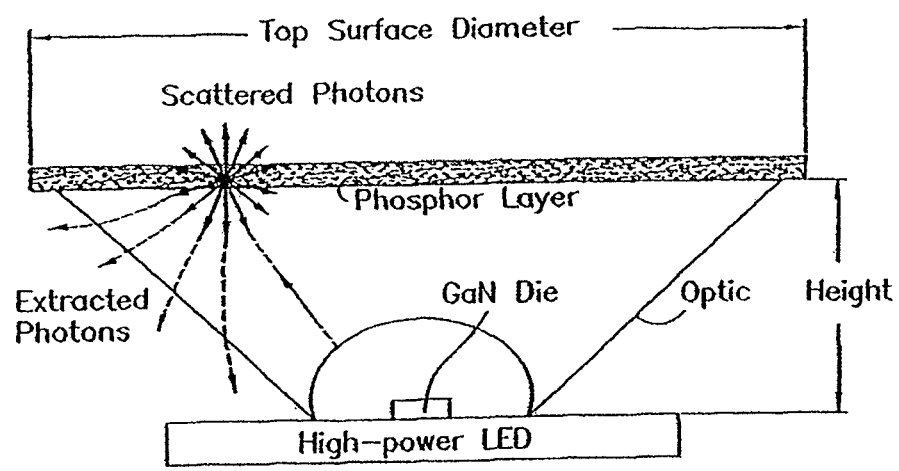
FIG. 13 is a schematic diagram depicting a high powered light emitter radiating light towards a down conversion material by way of an optical element, in accordance with an exemplary embodiment of the present invention.

A method by which most of the reflected light may be recovered is illustrated in FIG. 13, which shows schematically an LED package with SPE™ implemented. Unlike a typical conventional white LED package, where the phosphor is spread around the die, in the SPE™ package of the invention the phosphor layer is moved away from the die, leaving a transparent medium between the die and the phosphor. An efficient geometrical shape for the package may be determined via ray tracing analysis. The geometry of the package plays an important role, and the geometry shown in FIG. 13 efficiently transfers the light exiting the GaN die to the phosphor layer and allows most of the backscattered light from the phosphor layer to escape the optic. Compared with the typical conventional package, more photons are recovered with this SPE™ package. Here again the phosphor density determines the chromaticity of the final white light.

It is worth noting that the SPE™ package requires a different phosphor density to create white light with chromaticity coordinates similar to the conventional white LED package. This difference is a result of the SPE™ package mixing transmitted and back-reflected light with dissimilar spectra, whereas the conventional package uses predominantly the transmitted light.

To verify that the SPE™ package shown in FIG. 13 provides higher light output and luminous efficacy, an experiment was conducted with twelve conventional high-flux LEDs, six 3 W blue and six 3 W white, obtained from the same manufacturer. A commercial optic that fit the profile requirements of the SPE™ package was found, and several were acquired for experimentation with the LEDs. Although this optical element did not have the desired geometry shown in FIG. 13 to extract most of the backscattered light, it was sufficient to verify the hypothesis. The top flat portion of the experiment's secondary optic was coated with a predetermined amount of YAG:Ce phosphor. The required phosphor density was determined in a separate experiment by systematically varying the amount of phosphor density, analyzing the resulting chromaticity, and selecting the density that produced a chromaticity close to that of the commercial white LED used in the experiment. To compare the performances of the two packaging concepts, the white LEDs were fitted with uncoated secondary optics. The light output and the spectrum of the commercial white LEDs were measured in an integrating sphere, and the current and the voltage required to power the LEDs were also measured. The same measurements were repeated for the SPE™ packages, which included blue LEDs fitted with phosphor-coated secondary optics, as shown in FIG. 13.

The average luminous flux and the corresponding average efficacy for the SPE™ LED packages were found to be 90.7 lm and 36.3 lm/W, respectively. The average luminous flux and the corresponding average efficacy for the typical white LED packages were 56.5 lm and 22.6 lm/W, respectively. Therefore, the SPE™ LED packages on average had 61% more light output and 61% higher luminous efficacy. The variation of luminous flux and corresponding efficacy between similar LEDs was small, with a standard deviation of less than 4%. The SPE™ packages consistently had higher lumen output and higher efficacy compared with the typical conventional white LED packages.

The impact of current on light output and efficacy was also measured on two LED packages, one typical white LED and one SPE™ package. These two LEDs were subjected to the same light output measurement procedure, but their input current was decreased from 700 mA to 50 mA in several steps, and the corresponding photometric and electrical data were gathered. At very low currents, the SPE™ package exceeded 80 lm/W, compared to 54 lm/W for the conventional package.

With the SPE™ package, the backscattered photons are extracted before they are absorbed by the components within the LED. It is essential that the phosphor layer be placed farther away from the die, and the backscattered photons be extracted before they undergo multiple reflections within the package. Moving the phosphor away from the die has an additional benefit: the life of the white LED is also be improved, as demonstrated in an earlier paper (Narendran, N., Y. Gu, J. P. Freyssinier, H. Yu, and L. Deng. 2004. Solid-state lighting: Failure analysis of white LEDs. Journal of Crystal Growth 268 (3-4): 449-456).

An alternate method of the present invention to recover a portion of the back transferred radiation is to coat the sides of the secondary optics with a reflective material, as shown in FIGS. 5A and 5B. Although the efficacy may improve compared to a conventional white LED package, the gain is not as much, because the back transferred radiation bounces back and forth between the phosphor layer and the reflectors, and a good portion of this radiation is absorbed and lost as heat. A drawback of this method is by increasing the path length of the short-wavelength radiation traveling through the surrounding epoxy material, the epoxy degrades faster and thus shortens the useful life of the white LED.

It will be understood that the geometry of the SPE™ package shown in FIG. 13 is not limited to this specific shape. Alternate shapes may be used to recover the back transferred radiation more efficiently, while addressing other design concerns, such as color and life. As one example, in the configuration of FIG. 13, the inventors discovered that a preferred size for the top surface diameter is about 20 mm and a preferred size for the height is about 11 mm.

In summary, the present invention recovers the back transferred radiation from the down conversion material layer or the diffuser layer. In addition, the overall light output and the corresponding luminous efficacy of the LED system may be increased significantly compared to its conventional package. At the same time, the optic device may mix multiple spectra to create white light and other shades of colors while with uniform illumination and color. Applications of embodiments of the invention include general illumination and backlighting.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A light-emitting apparatus, comprising:
a light source;
a structure having a top surface connected to the light source and a bottom surface being a lowest surface of the light-emitting apparatus right beneath the light source;
a reflector separated from the structure, and having a reflective surface right above the top surface; and
a phosphor layer separated from the reflector, and having an inner surface facing the light source and an outer surface for radiating a light striking the reflector.

2. The light-emitting apparatus of claim 1, further comprising a transparent medium between the phosphor layer and the reflector.

3. The light-emitting apparatus of claim 1, further comprising an optic element associated with the phosphor layer and arranged between the light source and the reflector.

4. The light-emitting apparatus of claim 1, wherein the phosphor layer is arranged in a curved shape.

5. The light-emitting apparatus of claim 1, wherein the phosphor layer and the reflector are arranged in a similar geometric shape.

6. A light-emitting apparatus, comprising:
one or more light emitters configured to emit a first light, and having a front surface, a rear surface, a right surface, and a left surface;
a base having a plane facing the rear surface;
a wall arranged near the base, and having an inner surface and outer surface; and
a phosphor layer arranged over the front surface without overlapping the wall, and excited by the first light to induce a second light which is directed to enter the wall from the inner surface and exit the wall from the outer surface.

7. The light-emitting apparatus of claim 6, wherein the wall is inclined against the plane by an angle greater than 90 degree.

8. The light-emitting apparatus of claim 6, wherein the wall is arranged over the right surface or the left surface.

9. The light-emitting apparatus of claim 6, wherein the first light has a narrow beam and impinges on the phosphor layer.

10. The light-emitting apparatus of claim 6, wherein the one or more light emitters are arranged in an array.

11. The light-emitting apparatus of claim 6, wherein the phosphor layer is bonded to a transparent material.

12. The light-emitting apparatus of claim 6, wherein the phosphor layer is placed within a transparent material.

13. The light-emitting apparatus of claim 1, wherein the phosphor layer is configured to covert light from the light source into forward transferred radiation and back transferred radiation, the reflector is configured to reflect the forward transferred radiation.

14. The light-emitting apparatus of claim 13, wherein the back transferred radiation is substantially not reflected by the reflector.

15. The light-emitting apparatus of claim 1, wherein the light-emitting apparatus has a luminous efficacy over 80 lm/W.

\* \* \* \* \*

UNITED STATES PATENT AND TRADEMARK OFFICE
CERTIFICATE OF CORRECTION

Page 1 of 1

PATENT NO. : 8,960,953 B2
APPLICATION NO. : 13/758362
DATED : February 24, 2015
INVENTOR(S) : Nadarajah Narendran and Yimin Gu It is certified that error appears in the above-identified patent and that said Letters Patent is hereby corrected as shown below:

On Title page 2, item [63] Related U.S. Application Data, should read:

"application no. 10/583,105, filed June 15, 2006, now Pat. No. 7,819,549, which is a 371 of PCT/US2005/015736, filed May 5, 2005."

Signed and Sealed this
Twenty-third Day of June, 2015

Michelle K. Lee
*Director of the United States Patent and Trademark Office*